(12) United States Patent
Dodoc et al.

(10) Patent No.: US 8,064,040 B2
(45) Date of Patent: Nov. 22, 2011

(54) PROJECTION OBJECTIVE, PROJECTION EXPOSURE APPARATUS AND REFLECTIVE RETICLE FOR MICROLITHOGRAPHY

(75) Inventors: Aurelian Dodoc, Heidenheim (DE);
Wilhelm Ulrich, Aalen (DE); Dieter Bader, Goeggingen (DE); Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 774 days.

(21) Appl. No.: 11/547,085

(22) PCT Filed: Mar. 18, 2005

(86) PCT No.: PCT/EP2005/002898
§ 371 (c)(1),
(2), (4) Date: Dec. 7, 2007

(87) PCT Pub. No.: WO2005/096098
PCT Pub. Date: Oct. 13, 2005

(65) Prior Publication Data
US 2008/0198353 A1  Aug. 21, 2008

Related U.S. Application Data

(60) Provisional application No. 60/557,384, filed on Mar. 30, 2004.

(51) Int. Cl.
*G03B 27/52* (2006.01)
*G03B 27/42* (2006.01)
(52) U.S. Cl. .......................... 355/55; 355/53
(58) Field of Classification Search .................. 355/53, 355/67, 55; 359/642, 774
See application file for complete search history.

(56) References Cited

U.S. PATENT DOCUMENTS

| | | | |
|---|---|---|---|
| 4,969,730 A | 11/1990 | van den Brandt | |
| 5,031,976 A | 7/1991 | Shafer | |
| 5,257,139 A | 10/1993 | Higuchi | |
| 5,523,193 A | 6/1996 | Nelson | |
| 5,691,541 A | 11/1997 | Ceglio et al. | |
| 5,717,518 A | 2/1998 | Shafer et al. | |
| 5,870,176 A | 2/1999 | Sweatt et al. | |

(Continued)

FOREIGN PATENT DOCUMENTS

DE  15 22 285 A1  8/1969
(Continued)

OTHER PUBLICATIONS

Markle, David A., Lithography: The Road Ahead, Industry Insights, Solid State Technology, Feb. 1999, p. 83-84.

(Continued)

*Primary Examiner* — Edward Glick
*Assistant Examiner* — Deoram Persaud
(74) *Attorney, Agent, or Firm* — Sughrue Mion, PLLC

(57) ABSTRACT

A projection objective for microlithography serves for imaging a pattern of a mask arranged in its object surface into an image field arranged in its image surface with a demagnifying imaging scale. It has a multiplicity of optical elements arranged along the optical axis of the projection objective, the optical elements being designed and arranged in such a way that the projection objective has an imageside numerical aperture NA>0.85 and a demagnifying imaging scale where |b|<0.05, and the planar image field having a minimum image field diameter suitable for microlithography of more than 1 mm.

34 Claims, 10 Drawing Sheets

U.S. PATENT DOCUMENTS

| | | | |
|---|---|---|---|
| 5,999,310 A | 12/1999 | Shafer et al. | |
| 6,060,224 A | 5/2000 | Sweatt et al. | |
| 6,064,517 A | 5/2000 | Chuang et al. | |
| 6,133,576 A | 10/2000 | Shafer et al. | |
| 6,238,852 B1 | 5/2001 | Klosner | |
| 6,285,488 B1 | 9/2001 | Sandstrom | |
| 6,312,134 B1 | 11/2001 | Jain et al. | |
| 6,439,726 B1 | 8/2002 | Piehler | |
| 6,461,908 B2 | 10/2002 | Stolk et al. | |
| 6,504,644 B1 | 1/2003 | Sandstrom | |
| 6,560,041 B2 * | 5/2003 | Ikeda et al. | 359/749 |
| 6,596,718 B1 | 7/2003 | Flohr et al. | |
| 6,894,834 B2 | 5/2005 | Mann et al. | |
| 2001/0022691 A1 | 9/2001 | Furter et al. | |
| 2004/0114217 A1 | 6/2004 | Mann et al. | |
| 2005/0180011 A1 | 8/2005 | Mann et al. | |
| 2006/0198028 A1 | 9/2006 | Ulrich et al. | |

FOREIGN PATENT DOCUMENTS

| | | |
|---|---|---|
| DE | 19731291 A1 | 1/1998 |
| DE | 10139177 A1 | 2/2003 |
| JP | 02 160237 A | 6/1990 |
| JP | 2001297980 A | 10/2001 |
| JP | 2001517806 T | 10/2001 |
| JP | 2002506230 T | 2/2002 |
| JP | 2002506232 T | 2/2002 |
| JP | 2008276272 A | 11/2008 |
| WO | 9908134 A2 | 2/1999 |
| WO | WO 03/016977 A2 | 2/2003 |

OTHER PUBLICATIONS

Mignardi, Michael A., Digitial Micromirror Array for Projection TV, Texas Instruments, Jul. 1994, PennWell Publishing Company.

Glatzel, Erhard, New Lenses for Microlithography, Zeiss-Inform Oberkochen, Germany, vol. 26, pp. 8-13 (1981/82), No. 92 E.

Bruning, John H., Optical Lithography—Thirty years and three orders of magnitude: The evolution of optical lithography tools, SPIE vol. 3049, pp. 14-27, Tropel Corporation.

* cited by examiner

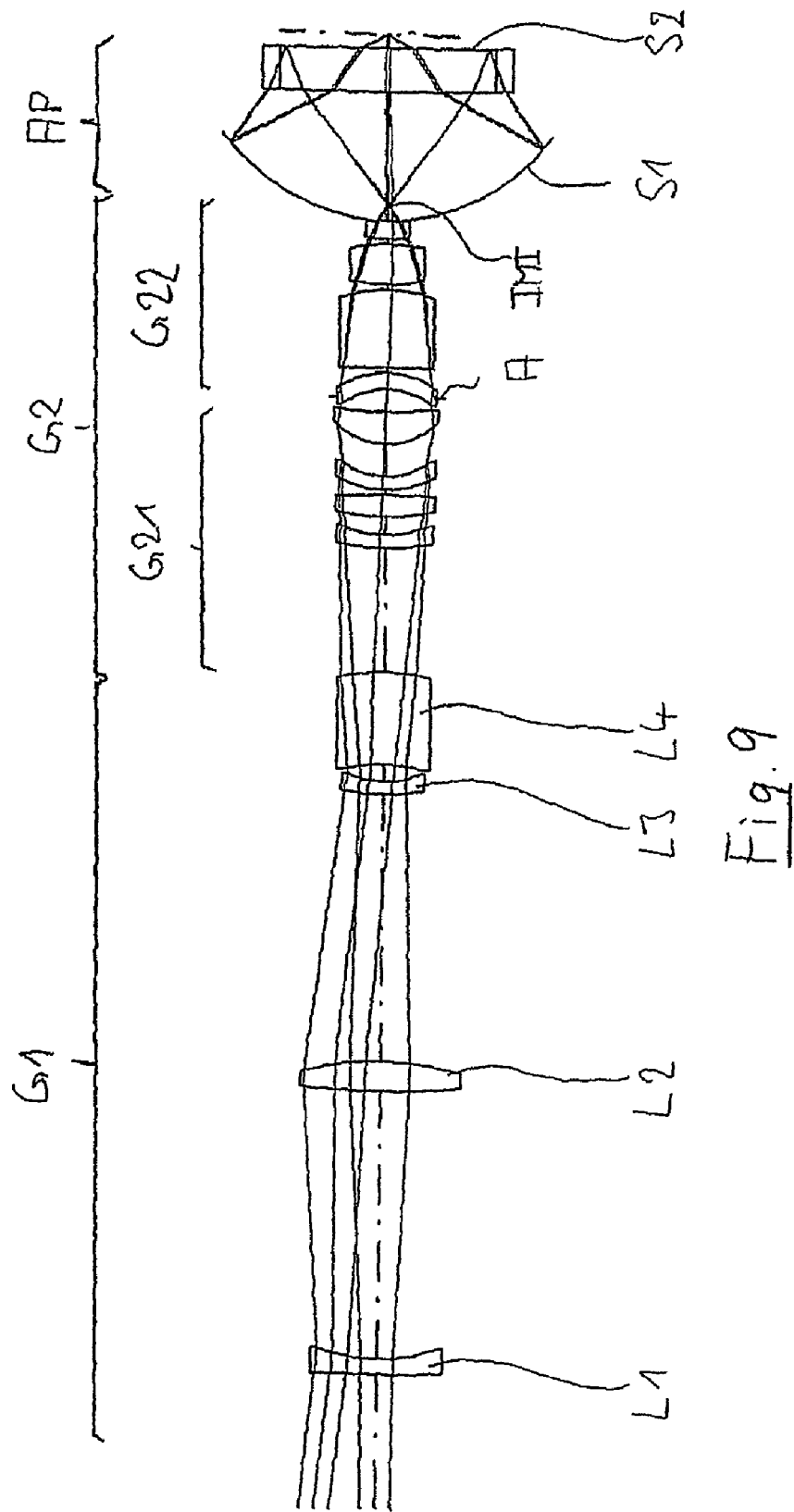

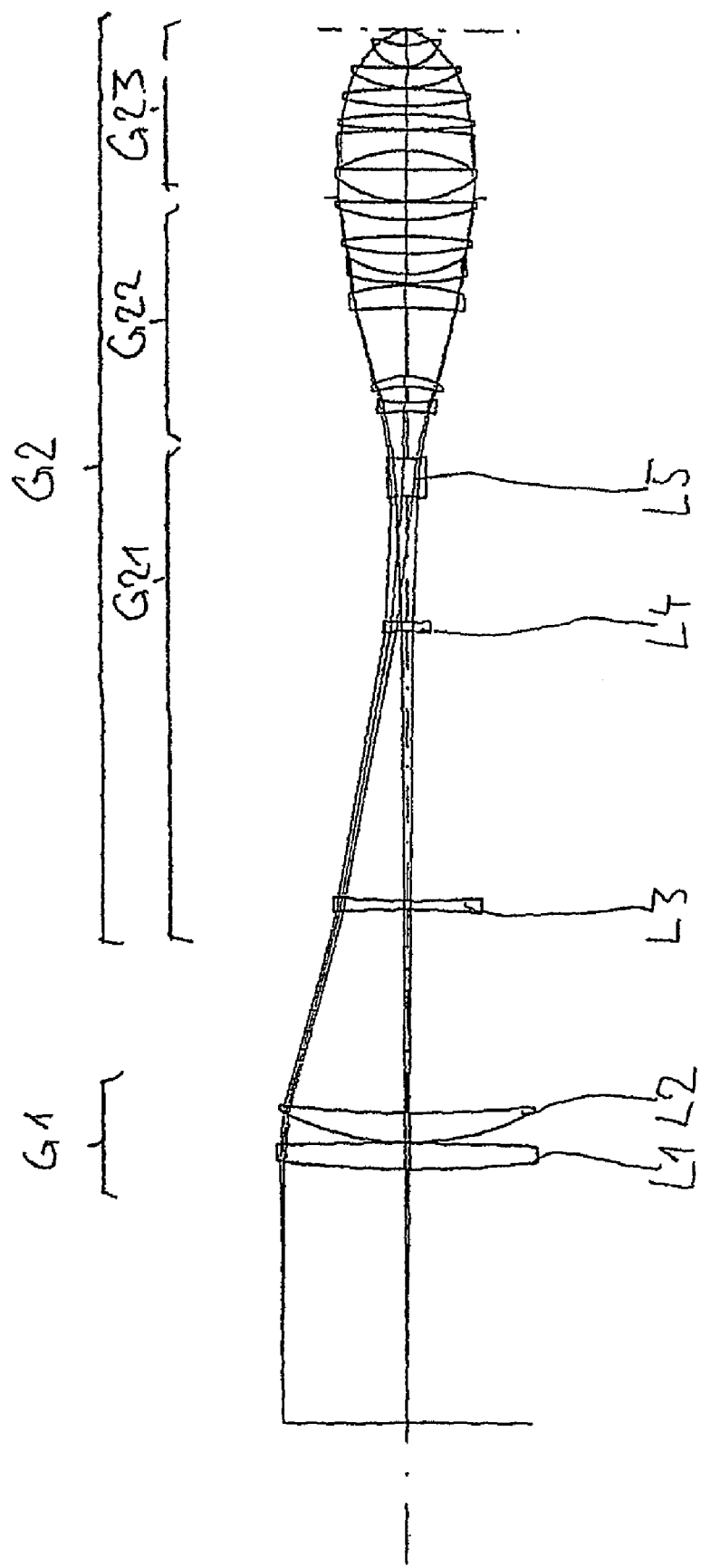

US 8,064,040 B2

PROJECTION OBJECTIVE, PROJECTION EXPOSURE APPARATUS AND REFLECTIVE RETICLE FOR MICROLITHOGRAPHY

This application is the National Stage of International Application No. PCT/EP2005/002898, filed Mar. 18, 2005, which was published under PCT Article 21(2) in English, and which claims the benefit of U.S. Provisional Application No. 60/557,384, filed Mar. 30, 2004.

BACKGROUND OF THE INVENTION

1. Field of the Invention

The invention relates to a projection objective for imaging a pattern arranged in an object surface of the projection objective into an image field arranged in the image surface of the projection objective with a demagnifying imaging scale, to a microlithography projection exposure apparatus having such a projection objective, and to a reflective mask suitable for use in such a projection exposure apparatus. A preferred field of application of the invention is so-called "maskless lithography".

2. Description of the Related Prior Art

Photolithographic projection objectives with a demagnifying imaging scale (reduction objectives) have been used for several decades for the photolithographic fabrication of semiconductor components and other finely patterned devices. They serve for projecting a pattern, usually provided on a mask (photomask or reticle) onto an article coated with a light-sensitive layer with very high resolution on a demagnifying scale. Most conventional masks carry a fixedly pre-defined pattern corresponding e.g. to a specific functional layer of a semiconductor component. Such masks with fixedly pre-defined patterns encompass various types of masks, for example binary masks, diverse phase shift masks or hybrid masks. They may be formed as a transmission mask or reflection mask. Masks are also referred to hereinafter as reticles. Demagnifying imaging scales $\beta$ of 1:4 or 1:5 have become customary in the meantime in conventional projection systems.

Conventional projection systems are designed to image a planar mask onto a planar image field. Accordingly, measures for correcting the image field curvature (Petzval correction) are provided in the projection objectives. For projection lithography on curved substrates, the U.S. Pat. No. 6,461,908 B1 proposes using a curved mask having a form identical to the form of the curved substrate. The curved mask is fabricated in a contact method.

The U.S. Pat. No. 5,257,139 discloses a purely reflective reduction objective for extreme ultraviolet radiation (EUV), wherein the object surface and/or the image surface are curved concavely with respect to the projection objective.

In order to be able to produce ever finer structures, firstly attempts are being made to increase the image-side numerical aperture (NA) of the projection objectives further and further. Secondly, ever shorter wavelengths are being used, in particular UV light having wavelengths of less than 260 nm, for example 248 nm, 193 nm or 157 nm. Reducing the feature sizes of the patterns present on the mask can also contribute to reducing the size of the structures produced on the image side. However, the fabrication of defect-free masks with fixedly predefined, extremely fine structures is complicated and expensive. Maskless technologies, such as are described by way of example in the article "Lithography: The road ahead" by D. A. Markle in: Solid State Technology, February 1999, p. 84 et seq., are therefore being developed.

The term "maskless lithography", as is used in this application, relates generally to lithography techniques which do not use masks with fixedly predefined patterns, or do not exclusively use such masks.

One known, "maskless" lithography technique involves using reflective reticles (reflection masks) with individually drivable mirror regions. The pattern of the mask can thus be altered by suitable driving of the mask. The patterns to be imaged may be produced for example with the aid of deformable or movable micromirrors, as is shown in the U.S. Pat. No. 6,238,852 B1. The publication "Digital Micromirror Array for Projection TV" by M. A. Mignard, Solid State Technology, July 1994, pp. 63-68 discloses drivable micromirror arrays. The use of such planar mirror arrangements with an array of individually drivable individual mirrors as object to be imaged in projection exposure apparatuses is the subject matter of the patent specifications U.S. Pat. No. 5,523,193, U.S. Pat. No. 5,691,541, U.S. Pat. No. 6,060,224, U.S. Pat. No. 6,312,134 and U.S. Pat. No. 5,870,176. The projection objectives shown in the exemplary embodiments described therein are only represented schematically.

The applicant's international patent application WO 03/016977 A2 shows various projection exposure apparatuses of purely reflective construction which are suitable for projection exposure in the extreme ultraviolet range (EUV) and which use reflective reticles in the form of drivable micromirror arrays. Both the illumination system, by means of which the drivable reflective mask is illuminated obliquely, and the projection objective, which produces a highly demagnified image of the pattern formed by the reflection mask on the substrate to be exposed, have a center obscuration on account of the use of centrally perforated concave mirrors. An abaxial object field is illuminated during the oblique illumination of the planar reticle. Image-side numerical apertures of up to NA=0.6 are achieved given demagnifying imaging scales of up to 1:100.

The applicant's German patent application DE 100 05 189 A1 (corresponding to U.S. Pat. No. 6,596,718 B1) discloses projection exposure apparatuses having purely refractive or catadioptric projection objectives which use a planar reflective reticle with a fixedly predefined pattern. A beam splitter cube is provided in the reduction objectives, for which typical reduction scales of 1:4 and typical NA values of up to NA>0.5 are specified, said beam splitter cube serving for superposing the illumination beam path of the illumination system and the imaging beam path of the projection objective. The illumination light radiated laterally into the projection objective impinges centrally on the reflective reticle after reflection at the beam splitter surface. Optical elements that are utilized both in the illumination beam path and in the imaging beam path are situated between the beam splitter cube and the reflective reticle.

Laterally coupling illumination radiation into the imaging beam path of an optical imaging system with the aid of a beam splitter is known from the area of ultraviolet microscopy. The patent specification U.S. Pat. No. 5,999,310 shows an example of a UV broadband microscope with object-side NA=0.9 and variable magnification up to 100:1.

The U.S. Pat. No. 6,439,726 shows a projection objective—intended for video projection—with an integrated illumination system, when the optical axis of the illumination system is at a certain angle with respect to the optical axis of the projection objective. Inclined coupling of illumination light into a projection system is also disclosed in U.S. Pat. No. 4,969,730.

The terms "refractive projection objective" and "purely refractive projection objective" are used in this application interchangeably and in accordance with their ordinary and accustomed meaning in the art, to describe projection objectives whose imaging elements are all lenses.

SUMMARY OF THE INVENTION

One object of the invention is to provide a projection objective by means of which extremely fine structures can be fabricated in a cost-effective manner during the microlithographic fabrication of finely patterned devices. A further object of the invention is to provide a projection objective which enables flexible production of finely patterned devices by means of microlithography. A further object of the invention is to provide a microlithographic projection exposure apparatus which enables flexible fabrication of finely patterned devices with extremely fine structures in a cost-effective manner.

These and other objects are achieved, in accordance with one aspect of the invention, by means of a projection objective for imaging a pattern arranged in an object surface of the projection objective into an image field arranged in the image surface of the projection objective with a demagnifying imaging scale, the projection objective comprising: a multiplicity of optical elements arranged along an optical axis of the projection objective, the optical elements being designed and arranged in such a way that the projection objective has an image-side numerical aperture NA>0.85 and a demagnifying imaging scale where $|\beta|<0.05$, and the image field having a minimum image field diameter of more than 1 mm.

The following condition preferably holds true for the magnitude $|\beta|$ of the imaging scale $\beta$: $|\beta|<0.02$, in particular it may be the case that $|\beta|\leq 0.01$.

In microlithography, planar image fields having a large minimum image field diameter, which is typically at least a factor of 10 greater than the typical field diameter in microscopes, are a prerequisite for an economic fabrication process for finely patterned devices. They require particular design measures, in particular for correcting field-dependent aberrations. The combination of high imageside numerical apertures and great demagnifying scales permits extremely fine feature sizes to be produced on the exposed article with sharp contours even in the case of masks that can be provided relatively cost-effectively with coarsely patterned patterns. Despite the small feature sizes obtainable on the image side, which may be in the region of 100 nm or less, this can be achieved, as required, with projection objectives of relatively simple construction, for example with purely refractive projection objectives which can be designed for operating wavelengths of 193 nm or more. Since cost-effective materials that are readily controllable in terms of processing are available for this wavelength range both for the fabrication of lenses and for the fabrication of optical coatings, it is possible to provide projection objectives having high imaging quality at tenable cost.

In preferred embodiments, the minimum image field diameter is 5 mm or more; in particular, it may also be 10 mm or more. With image fields of this size, micropatterned devices can be exposed both in the step-and-repeat method and in the step-and-scan method.

There are embodiments of projection objectives according to the invention which have a planar object surface. These can be used in conjunction with conventional planar transmission masks or reflection masks or phase shift masks, in which case the patterns formed on the masks may be very coarse on account of the great demagnification. This reduces the costs in mask fabrication. Typical feature sizes of the patterns of usable masks may be of the order of magnitude of 1 μm or 10 μm or more.

In other embodiments with a planar image surface, the object surface of the projection objective has a curvature that is concave with respect to the projection objective. The center of curvature thus lies on that side of the object surface which faces the projection objective. Preferred radii R of curvature of the object surface lie in the range $0.525 \cdot Dmax < RO < 100 \cdot Dmax$ in systems with a maximum object field diameter Dmax and/or in the range $0.525 \cdot Dmax < RO < 10 \cdot L$ in systems with a structural length L. In projection objectives in which only the image surface is planar, while the object surface is curved concavely on the object side, complicated correction means for correcting the image field curvature (Petzval correction) can be largely or completely dispensed with. By way of example, it is possible to reduce the great variation of the beam bundle diameter that leads to a pronounced convexity and waist structure in Petzval-corrected systems. This permits the construction of cost-effective systems with fewer lenses and smaller maximum lens diameters. If catadioptric systems with at least one concave mirror are utilized, the latter can be given moderate dimensions because no major contributions to the Petzval correction are required.

The curvature of the object surface that is concave with respect to the projection objective, in particular with the preferred radii of curvature, may also be advantageous in the case of projection objectives with imaging scales $|\beta\oplus>0.05$, for example in the case of such projection objectives where $0.05\leq|\beta|<0.1$, where $\beta=0.25$ or where $\beta=0.2$.

In embodiments that are particularly adapted to the use of reflective reticles, the projection objective has an object-side element group with at least one optical element of the projection objective and an image-side element group with at least one optical element of the projection objective, a coupling-in device that is trans-missive to the projection radiation of the imaging beam path and serves for coupling illumination radiation into the projection objective being arranged between the object-side element group and the image-side element group. By means of the coupling-in device, the illumination radiation can firstly be directed onto the reflective reticle, from which it is then reflected for imaging in the direction of the image plane of the projection objective. A central reflected light illumination of the reflective reticle is possible as a result. The imaging beam path and the illumination beam path can be superposed with the aid of the coupling-in device. In contrast to conventional systems, the interface between illumination system and imaging optic is then no longer the region of the object surface in which the mask is situated, but rather the entrance of the coupling-in device facing the illumination system.

The coupling-in device may be designed as a beam splitter with a beam splitter surface oriented obliquely with respect to the optical axis of the projection objective. A beam splitter cube or a beam splitter block may be involved, in particular with a polarization-selective beam splitter surface (polarization beam splitter). The use of partly transmissive mirrors or beam splitter plates placed obliquely into the beam path is also possible. In particular, provision may be made of beam splitter elements suitable for coupling in light, as are described in the applicant's U.S. Pat. No. 6,596,718 B1. The disclosure content of this document is incorporated in the subject matter of this description in its entirety by reference.

In some embodiments, at least one constriction of the imaging beam path is provided between the object surface and the image surface in the projection objective. Such regions having minimal beam heights in comparison with the surroundings are also referred to hereinafter as a "waist". The coupling-in device is preferably fitted in the region of such a constriction of the imaging beam path and can accordingly be given small dimensions, so that material can be saved for example in the production of a beam splitter block. Advantages may also be afforded with regard to the structural space requirements for coupling the illumination system to the projection objective. Moreover, it is sufficient to employ illumination systems which supply relatively small beam diameters of the exit radiation.

Preferably, only a single waist is provided. Purely refractive, rotationally symmetrical projection objectives having a single constriction region with a minimum beam bundle diameter can be constructed in a particularly compact and material-saving fashion.

In another variant of a projection objective, the latter likewise has an object-side element group and an image-side element group, the two element groups in each case comprising at least one optical element of the projection objective. By means of a suitable coupling-in device, illumination radiation is radiated obliquely into the projection objective between the object-side and the image-side element group, so that at least one optical element of the object-side element group is utilized both by the illumination beam path and by the imaging beam path and is thus both part of the illumination system and part of the projection objective. In this embodiment, at least one optical element of the illumination system is arranged eccentrically with respect to the optical axis of the illumination system, namely the at least one optical element of the object-side element group of the projection objective. By virtue of the oblique coupling-in, in the case of which the coupling-in device may lie outside the imaging beam path of the projection objective, an imaging with unpolarized light is possible and the transmission of the projection objective is not impaired by the coupling-in device.

In one embodiment of a refractive projection objective, the latter has a first lens group with positive refractive power following the image surface, a second lens group with negative refractive power following the first lens group, a third lens group with positive refractive power following the second lens group, and a fourth lens group with positive refractive power following the third lens group, and also a system diaphragm arranged in a transition region from the third lens group to the fourth lens group. The single constriction region having minimum beam bundle diameters is formed in the region of the second lens group with negative refractive power. A coupling-in device for illumination light, for example a polarization beam splitter, may preferably be arranged here between two lenses with negative refractive power in each case. In other embodiments, an oblique coupling-in of the illumination light may be provided in this region, in particular between two negative lenses of the second lens group. With the aid of the positive first lens group, it is possible for the projection objective to have a virtually telecentric beam path in the object space. The telecentric error may be, in particular, less than 50 mrad, preferably less than 10 mrad, in particular less than 1 mrad.

In other embodiments, the input-side first lens group with positive refractive power may be obviated, so that the system commences with a lens group with negative refractive power. Such embodiments are adapted particularly for use with curved reticles. In this case, the beam path in the object space of the projection objective may deviate significantly from the telecentric condition. In particular, telecentric errors of more than 50 mrad may be provided. The telecentric error is essentially determined by the angle of inclination of the main imaging beam with respect to the optical axis and generally depends on the beam height.

In other embodiments of projection objectives according to the invention, provision is made of a first lens group with negative refractive power following the image surface, for generating a demagnified virtual intermediate image of the object field, and a succeeding second lens group with positive refractive power, which serves for demagnified imaging of the virtual intermediate image into the image surface. Preferred systems may be regarded as systems of the retrofocus N-P type. In one embodiment, object-side telecentricity is achieved by virtue of the fact that an additional lens group with positive refractive power is inserted upstream of the input-side lens group with negative refractive power. Both refractive and catadioptric projection objectives of this type are possible. In one embodiment of a catadioptric projection objective, the image-side lens group with positive refractive power comprises a concave mirror—which is concave with respect to the image plane—with a central opening and a backreflection mirror—which lies opposite the concave mirror—with an object-side mirror surface for backreflection of the radiation passing through the opening in the direction of the concave mirror. In one embodiment, the backreflection mirror is convexly curved, while it is embodied as a planar mirror in another embodiment.

The invention also relates to a projection exposure apparatus for microlithography having an illumination system for illuminating a pattern that is arranged in an object surface of the projection objective with radiation from a primary radiation source, and having a projection objective according to the invention.

In one embodiment, the illumination system has an input-side element group—following the light source—with at least one optical element of the illumination system and an output-side element group with at least one optical element of the illumination system, the output-side element group simultaneously being a part of the projection objective. This makes it possible for one or a plurality of lenses to be utilized both by the imaging beam path of the projection objective and by the illumination beam path of the illumination system. In this case, both a central illumination of the reticle and an oblique illumination of the reticle are possible depending on the embodiment. In embodiments with central illumination, the illumination system has an optical axis that coincides with the optical axis of the projection objective between a coupling-in device and the object surface of the projection objective. As an alternative, the optical axis of the illumination system may also form a finite angle with that of the projection objective (oblique illumination). In this case, optical elements of the output-side element group of the illumination system may be arranged eccentrically with respect to the optical axis of said illumination system and the exit plane of the illumination system is inclined with respect to the optical axis of the illumination system.

In both cases, it may be expedient for at least one optical element with at least one aspherical surface to be arranged in the input-side element group of the illumination system, in order to achieve a good adaptation of the illumination radiation to the projection objective. The aperture diaphragm of the illumination system is preferably arranged in the region of the input-side element group. The illumination system is preferably designed such that the imageside numerical aperture of the illumination system is greater than or equal to the object-side numerical aperture of the projection objective. As a result, the pupil of the projection objective can be fully illuminated.

In general, it is expedient for the output-side element group of the illumination system to be designed such that illumination radiation impinges essentially over the entire illuminated area essentially perpendicularly on the object surface of the projection objective, which is simultaneously the exit surface of the illumination system. Therefore, in embodiments of projection objectives with a planar object surface, the illumination system is preferably designed for a telecentric beam path at its exit. In projection objectives with a curved object surface, by contrast, the exit radiation of the illumination system may deviate greatly from the telecentric condition.

The invention also relates to a reflective reticle which, in particular, is provided for use in conjunction with a projection objective according to the invention but can also be used beneficially with other projection objectives. The reticle is designed as a concave reflection mask with a curvature that is concave at a mirror side. The curvature is adapted to the curvature of the object surface of the associated projection objective. Preferred radii RO of curvature of the mirror surface are in the range $0.525 \cdot Dmax < RO < 100 \cdot Dmax$ in systems with a maximum usable mirror diameter Dmax. With the aid of such curved reflection masks, it is possible to fully utilize the abovementioned advantages in the construction of projection objectives with a curved object surface (e.g. reducing the design measures provided for the correction of image field curvature).

In a preferred embodiment, the reflection mask is configured as a mirror arrangement with an array of individually drivable individual mirrors (micromirror array). Suitable setting of a spatial distribution of the reflectivity of the individual mirrors enables the pattern to be set in a variable manner, which is then projected through the projection objective in greatly demagnified fashion into the image plane of the projection objective.

The reflectivity of the individual mirrors can be set in various ways. Embodiments with tiltable individual mirrors are preferred, which make it possible, by means of tilting the individual mirrors, for the radiation incident on the individual mirror either to be reflected into the projection objective or for the impinging radiation to be directed past the projection objective. For this purpose, a surface which transmits or reflects the radiation reflected from the reticle depending on the angle of impingement, e.g. a total reflection surface, may be provided in the projection objective.

The reflection mask preferably has a curvature that is rotationally symmetrical in relation to an axis of symmetry of the reflection mask and individual mirrors of the mirror arrangement can be tilted relative to other individual mirrors of the mirror arrangement about tilting axes that are oriented perpendicularly to radial directions with respect to the axis of symmetry. A particularly favorable construction is possible as a result of this.

In order to ensure an effective masking out of light, the individual mirrors of the reflection mask can be tilted with respect to the axis of symmetry of the reflection mask preferably by angles of inclination that are greater than a maximum aperture angle in the region of the object surface of the projection objective.

The individual mirrors are preferably arranged such that they essentially fill the area, in which case reflection-free regions present between the individual mirrors may have typical widths of a few μm, in particular of less than 1 μm.

A regular hexagonal form of individual mirrors is preferred. This enables, on the one hand, an almost perfect filling of the area, e.g. with a filling factor >95% or >98% or >99%. On the other hand, such a honeycomb structure can be used to generate linear structure elements of the pattern in many different directions by jointly driving in each case the individual mirrors of a row that corresponds to a structure direction of the pattern.

The invention also comprises a method for exposing light-sensitive substrates by means of a microlithography projection exposure apparatus. In the method, a reflection mask, comprising a mirror arrangement with an array of individually drivable individual mirrors, is illuminated with the aid of an illumination system. In this case, beam bundles of the illumination radiation are reflected at the individual mirrors of the mirror arrangement. A control unit drives the individual mirrors of the mirror arrangement in accordance with a predetermined pattern in such a way that only a portion of the beam bundles passes through the projection objective onto the light-sensitive substrate, so that the light-sensitive substrate is exposed by the beam bundles transmitted through the projection objective in accordance with the predetermined pattern. The reflection mask is preferably curved concavely at its mirror side.

The above and further features emerge not only from the claims but also from the description and from the drawings, in which case the individual features may be realized, and may represent advantageous embodiments protectable per se, in each case on their own or as a plurality in the form of subcombinations in an embodiment of the invention and in other fields.

The term "refractive projection objective" is used in this application to describe an entirely refractive projection objective whose imaging elements are all lenses.

BRIEF DESCRIPTION OF THE DRAWINGS

FIG. 9 shows a lens section through a second embodiment of a catadioptric reduction objective; and FIG. 10 shows a lens section through a fifth embodiment of a refractive reduction objective.

DETAILED DESCRIPTION OF PREFERRED EMBODIMENTS

In the following description of preferred embodiments, the term "optical axis" denotes a straight line or a sequence of straight line sections through the centers of curvature of spherical optical components or through the axes of symmetry of aspherical elements. The optical axis is folded at folding mirrors (deflection mirrors) or other reflective surfaces. In the examples, the object is a mask (reticle) having the pattern of a layer of an integrated circuit. A different pattern, for example of a grating, may also be involved. In the examples, the image is projected onto a wafer which is provided with a photoresist layer and serves as a light-sensitive substrate. Other substrates, for example elements for liquid crystal displays or substrates for optical gratings, are also possible.

Figure 1:
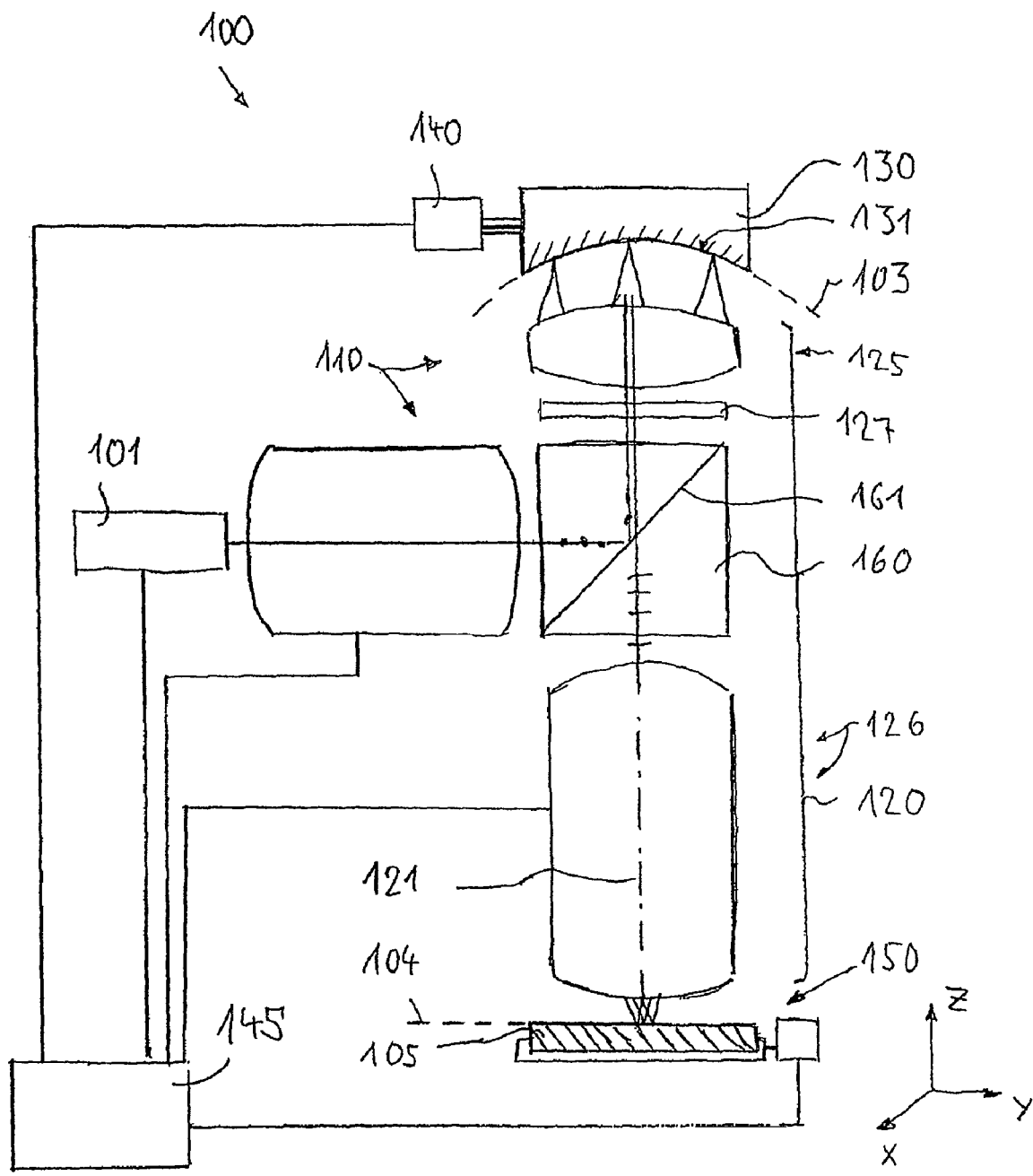
FIG. 1 shows an embodiment of a projection exposure apparatus according to the invention in which a curved reflection mask is used.

FIG. 1 schematically shows a microlithographic projection exposure apparatus in the form of a wafer stepper 100, which is provided for the fabrication of large scale integrated semiconductor components. The projection exposure apparatus 100 comprises as light source an ArF laser 101 having an operating wavelength of 193 nm, it also being possible to use other DUV or VUV lasers as light sources, for example an $F_2$ laser for 157 nm, an $Ar_2$ laser for 126 nm or an NeF laser for 106 nm. Longer wavelengths, for example 248 nm or 365 nm, can also be utilized. A downstream illumination system 110 generates from the light from the primary light source 101, in its spherically curved exit surface 103, a large, sharply delimited, very homogeneously illuminated illumination field that is adapted to the telecentric requirements of a downstream projection objective 120. The illumination system 110 has devices for selection of the illumination mode and, in the example, can be changed over between conventional illumination with a variable degree of coherence, annular field illumination and polar illumination, in particular dipole or quadrupole illumination.

A reflection mask 130 having a spherically concavely curved reflection surface 131 is arranged in the region of the exit surface 103 of the illumination system in such a way that the reflection surface coincides with the exit surface 103 of the illumination system. The reflection mask, which is also referred to hereinafter as reflective reticle, is held by a device 140 (reticle stage) for holding and manipulating the mask. In some embodiments, the reflective mask is set up for scanner operation.

In the light path downstream of the mask 130 there follows a purely refractive reduction objective 120 which, in the case of an imaging scale β=1:100, is designed for imaging a greatly demagnified image of a pattern formed by the reflection mask 130 into the planar image plane 104 of the projection objective 120. A semiconductor wafer 105 serving as a light-sensitive substrate is arranged in the region of the image plane 104 in such a way that its planar substrate surface, which is coated with a photoresist layer, essentially coincides with the image plane 104 of the projection objective 120. The wafer is held by a device 150 (wafer stage), which may comprise a scanner drive. The device 150 also comprises manipulators in order to move the wafer both in the z direction, that is to say parallel to the optical axis 121 of the projection objective 120, and in the x and y directions perpendicular to said axis. A tilting device having at least one tilting axis that runs perpendicularly to the optical axis is integrated. With the aid of a central computer unit 145, the light source 101, the illumination system 110, the projection objective 120, the reticle stage 140, the wafer stage 150 and also the reflection mask 130 can be driven in such a way that the exposure provided for the exposure step can be carried out in an optimized manner.

Further particular features are explained in greater detail in connection with FIGS. 1-4. The projection objective 120 that is rotationally symmetrical with respect to the optical axis 121 is designed in such a way that a spherically curved object surface 103 can be imaged, in a manner free of obscuration, into a planar image surface 104 with the imaging scale 1:100 given an image-side numerical aperture NA=0.9. In this case, an object field that is centered with respect to the optical axis 121 is imaged into a centered image field having an image field diameter of 4 mm. The object surface 103 is concave with respect to the image plane and has a radius RO of curvature of 400 mm, which is significantly less than the structural length L of the projection objective (L=1000 mm) given by the axial distance between the object surface 103 and the image surface 104 along the optical axis 121. The projection objective (FIG. 2) has an object-side element group 125 with four lenses and an image-side element group 126 with thirteen lenses, the aperture diaphragm A being arranged in the region of the largest beam bundle diameters of the image-side element group in such a way that strict telecentricity prevails in the image space. By contrast, the imaging beam path in the object space deviates from the telecentric condition, the telecentric error being in particular greater than 50 mrad. As can be discerned in FIG. 2, the object-side beam guidance is set in such a way that, during the exposure, the beam bundles, in the object space, are essentially perpendicular to the object surface 103. For the purpose of exactly setting the object-side beam angles, the entry surface of the projection objective, which entry surface directly follows the object surface and is curved convexly with respect to the object surface, is formed in aspherical fashion. The remaining lens surfaces are spherical, which simplifies the production and testing of the lenses. The exit surface of the projection objective, which exit surface is situated at a finite distance in front of the image plane 104, is curved concavely on the image side. This makes it possible to avoid an introduction of aberration, in particular of spherical aberration, as a result of this surface burdened with high angles of incidence.

Table 1 summarizes the specification of the design in tabular form. In this case, column 1 specifies the number of a refractive surface or surface distinguished in some other way, column 2 specifies the radius r of the surface (in mm), column 3 specifies the distance d between the surface and the succeeding surface (in mm), and column 4 specifies the material of the optical components. Column 5 specifies the usable free radii or half the free diameter of the lenses (in mm).

In the embodiment, the entry surface of the first lens, i.e. the lens surface nearest to the object surface, is aspherical. Table 2 specifies the corresponding aspherical data, an aspherical surface being calculated according to the following specification:

$$p(h)=[((1/r)h^2)/(1+\mathrm{SQRT}(1-(1+K)(1/r)^2h^2))]+C1*h^4+C2*h^6+\ldots$$

In this case, the reciprocal (1/r) of the radius specifies the surface curvature and h specifies the distance between a surface point and the optical axis (i.e. the beam height). Consequently, p(h) specifies the so-called sagitta, i.e. the distance between the surface point and the surface vertex in the z direction, i.e. in the direction of the optical axis. The constants K, C1, C2, . . . are reproduced in Table 2.

The projection objective can generally be utilized for imaging suitably curved masks into the image plane. The embodiment shown is particularly adapted to the use of reflective reticles (reflection masks) having a concavely curved mirror surface. For this purpose, a coupling-in device in the form of a beam splitter cube 160 is integrated into the projection objective between the object-side element group 125 and the image-side element group 126, with the aid of which beam splitter cube illumination light can be coupled centrally into the projection objective. The beam splitter 160 serves as an interface between the illumination system 110 and the projection objective 120. In this case, the illumination system 110 can be sub-divided into an entry-side element group 135 and an exit-side element group which is formed by the object-side element group 125 of the projection objective. The beam splitter cube 160 is arranged between these element groups. What can be achieved in this way is that a plurality of lenses, namely those of the element group 125, are utilized both by the illumination beam path of the illumination system and by the imaging beam path of the projection objective. The coupling-in device 160 is formed as a polarization beam splitter cube with a polarization-selectively effective planar beam splitter surface 161 at which the optical axis 111 of the illumination system is folded in such a way that its part situated between beam splitter surface 161 and object surface 103 coincides with the corresponding part of the optical axis 121 of the projection objective. A central illumination of the object field is possible as a result of this.

The illumination system is designed in such a way that the illumination light incident in the beam splitter cube 160 is s-polarized in relation to the plane of incidence spanned by the folded optical axis 111. As a result, the illumination light is firstly reflected from the beam splitter surface 161 in the direction of the reflective reticle or surface 103. Arranged between the beam splitter cube 160 and the object surface 103 or the reflective reticle is a delay device 127 having the effect of a λ/4 plate, which is passed through once in the illumination beam path between beam splitter surface 161 and reflective reticle, so that the reticle is illuminated with circularly polarized light. The light reflected in the direction of the image plane 104 once again passes through the λ/4 plate 127, so that it is p-polarized in relation to the beam splitter surface 161 the second time it enters the beam splitter cube and is thus transmitted by said beam splitter surface largely without any losses. There is thus a separation of the illumination beam path and of the imaging beam path in a combination of polarization beam splitter cube, passage twice through the λ/4 plate 127 and reflections at the reflective reticle.

Figure 2:
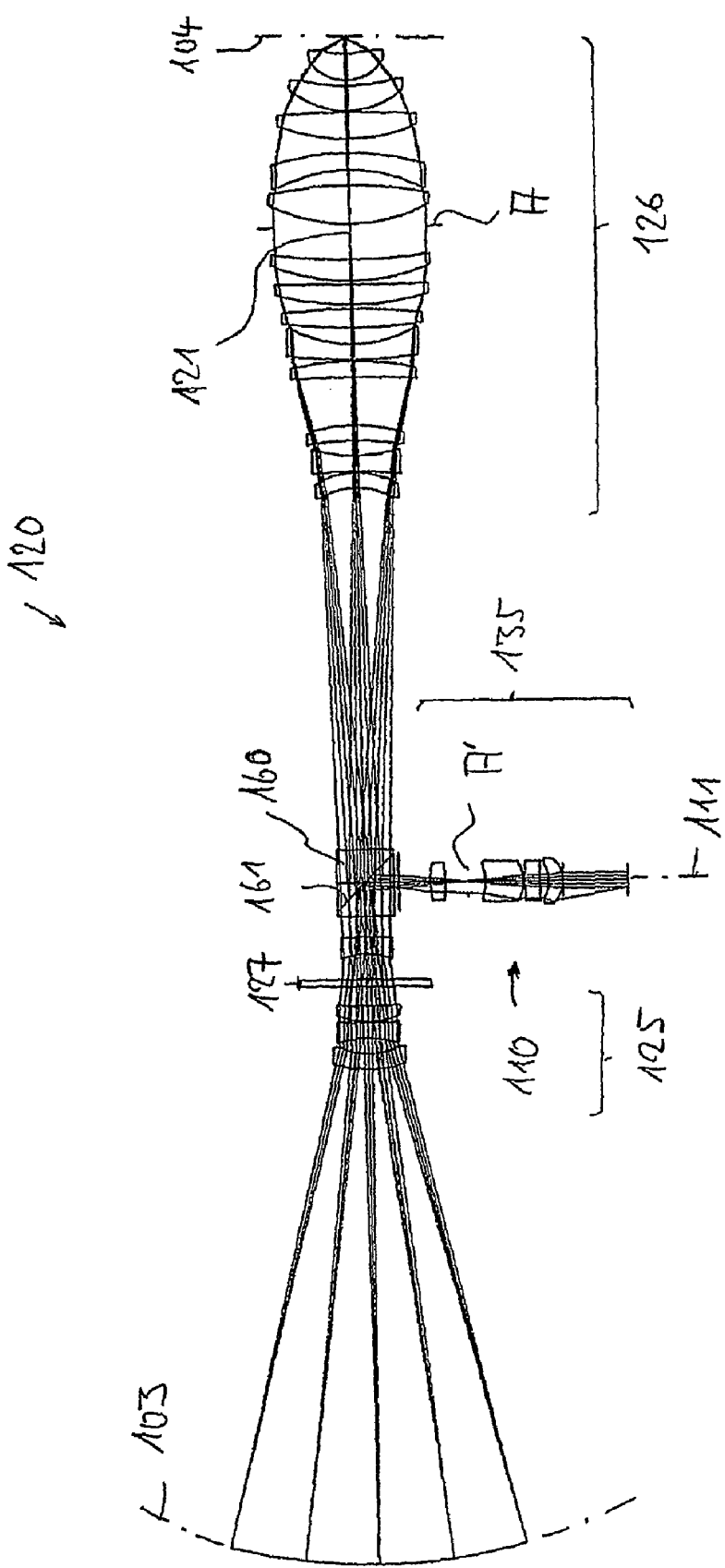
FIG. 2 shows a lens section through an embodiment of a refractive reduction objective, wherein illumination light is coupled in via a beam splitter between a curved object surface and the image plane.

FIG. 2 reveals that the beam splitter cube 160 is arranged in the region of minimum beam bundle diameters of the imaging beam path. This makes it possible to utilize small-volume beam splitter elements that can be provided cost-effectively with high quality.

The aperture diaphragm A' of the illumination system is arranged in the entry-side group 135. It is thus possible to set an image-side (exit-side) aperture of the illumination system that is preferably greater than or equal to the object-side aperture of the projection objective. A plurality of lenses of the entry-side group 135 have aspherical lens surfaces. The specification of the illumination system is specified in Tables 3 and 4.

Figure 3:
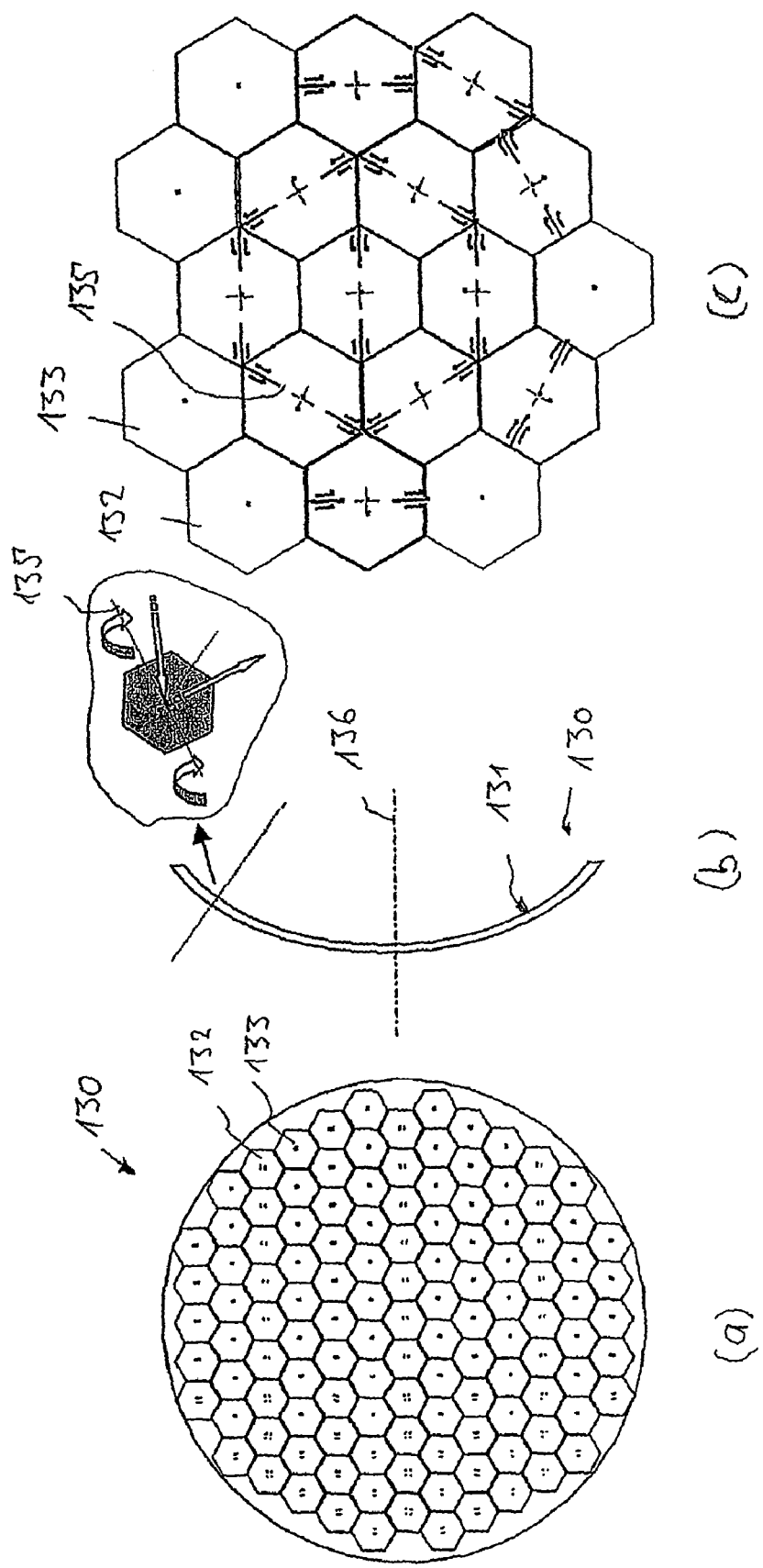
FIG. 3 shows different views of a curved reflection mask with a multiplicity of individually tiltable individual mirrors.
Figure 4:
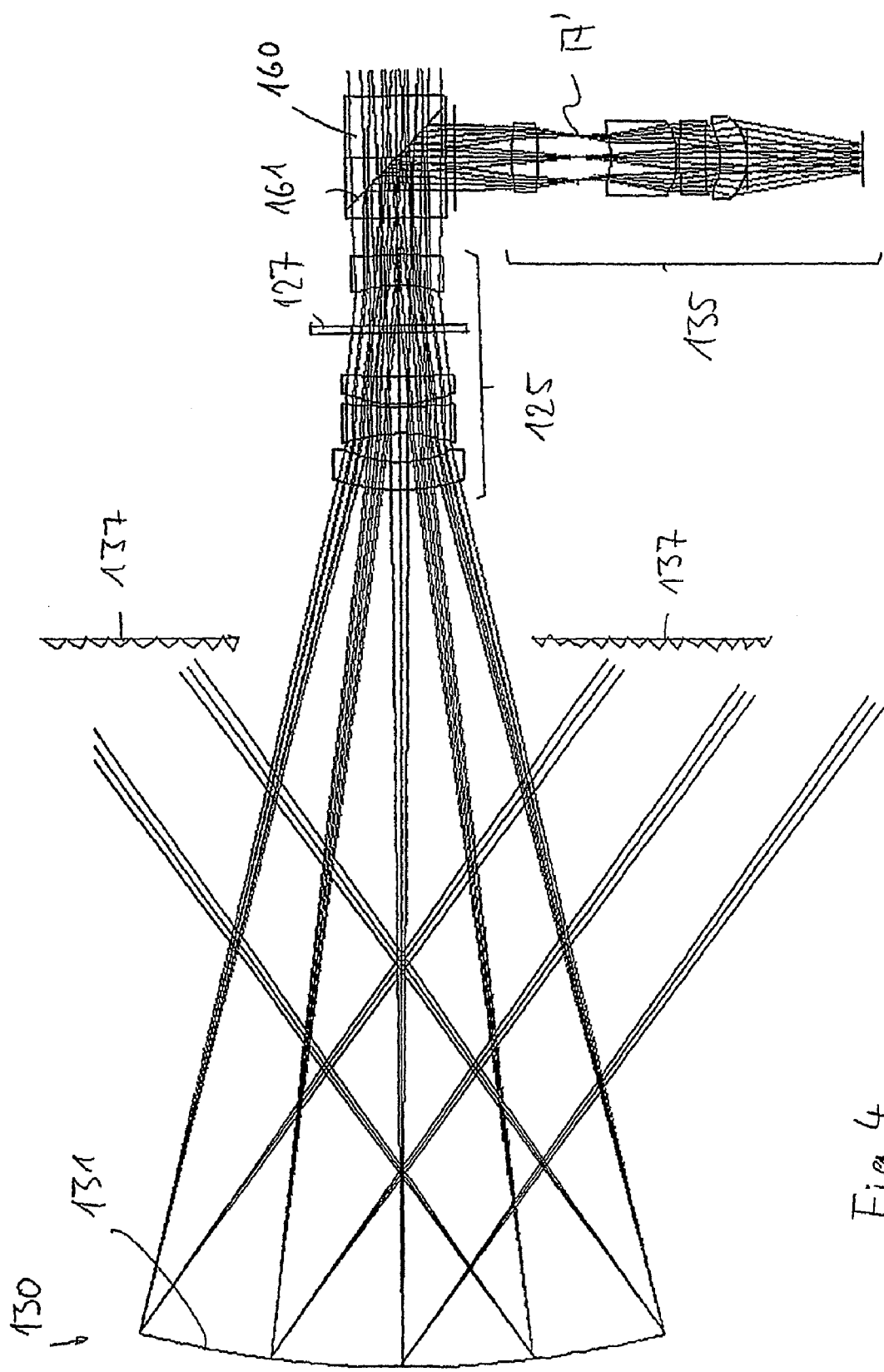
FIG. 4 shows a detail from the projection objective in accordance with FIG. 2, wherein a part of the illumination light is masked out with the aid of a curved reflection mask.

FIG. 3 schematically shows a preferred embodiment of a reflective reticle 130 having a concavely curved mirror surface, FIG. 3(a) showing an axial plan view, FIG. 3(b) showing an axial section and FIG. 3(c) showing an enlarged detail view with illustration of the tilting axes of tiltable mirror elements. The macroscopically concavely counter-curved reflection surface 131 of the reflection mask is formed by a multiplicity of hexagonal mirror elements (individual mirrors 132, 133) which are arranged such that they essentially fill the area and have minimum lateral distances of the order of magnitude of a few μm with respect to one another, so that they are relatively movable in relation to one another without contact being made. The hexagonal form permits an optimum degree of filling. Each mirror element is mounted in such a way that it can be tilted about a tilting axis 135 which perpendicularly intersects a radial direction with respect to the axis 136 of symmetry of the concave mirror 130 and which is directed in such a way that the normal to the surface of the respective mirror element, during a rotary movement of the mirror element about its tilting axis, remains in a plane which also includes the axis 136 of symmetry of the mirror arrangement 130 (FIG. 3b). Each of the mirror elements has three stable positions. In one position (reflection position), the normal to the surface of the mirror surface points in the direction of the normal to the macroscopically curved mirror surface 131, so that light that impinges essentially perpendicularly on the curved surface 131 is largely reflected back by itself. In a second position (deflection position), the beams are reflected at a great angle, so that they run past the lenses of the projection objective and can be absorbed by light traps 137 (FIG. 4). In this case, the angle of inclination of the mirror elements that can be obtained by means of the tilting is preferably greater than the aperture angle of the projection objective in the object space. As a result, a complete coupling-out of radiation is possible in the deflection position.

During operation of the projection exposure apparatus, illumination light is coupled in laterally with respect to the projection objective and impinges on the micromirror array of the curved reflection mask 130. In this case, beam bundles are reflected at the mirror elements (micromirrors) of the mirror arrangement. The computer unit 145 individually drives the individual mirrors in such a way that those mirror elements which correspond to a dark region in the desired mask pattern are tilted from the reflection position into the deflection position, so that the reflected light does not couple into the projection objective. The remaining portion of the beam bundles is reflected from the non-tilted mirror elements and passes through the projection objective to the image plane thereof in order to expose the light-sensitive substrate fitted there in accordance with the pattern that is predefined by the tilted and non-tilted individual mirrors. In this case, the individual micromirrors of the micromirror array which are not in the deflection position but rather in the reflection position are imaged onto the light-sensitive substrate with an imaging ratio of 1:100 of the projection objective. Given a typical maximum diameter of the hexagonal individual mirrors of 10 μm, images of the micromirrors of the order of magnitude of 100 nm arise in this way, so that structures of the order of magnitude of less than 100 nm can be produced by means of the diffraction-monitored projection on the wafer.

The embodiment shown is designed for a wafer stepper. In other embodiments of the invention, reflective masks may also be equipped or driven for scanner operation. In one embodiment, the reflective mask is mounted such that it can be rotated about an axis of rotation that passes through the center of curvature of the reflection surface and is oriented perpendicularly to the scanning direction provided. During the scanning operation, the mask is rotated about this axis, while synchronously with this a scanner drive of the wafer stage moves the wafer in the scanning direction. In another embodiment, the reflective mask as a whole is immobile, but the tilting of the individual mirrors can be controlled by an electronic driving in such a way that a predetermined pattern "migrates" progressively over the entire mirror surface, the illumination being correspondingly clocked in order in each case to enable a momentary exposure with a pattern defined by the tilting of the individual mirrors before a new pattern arises as a result of cyclic changeover of the individual mirrors, which new pattern is then transferred to the substrate again. Corresponding scanner operation of reflective masks is described in the U.S. Pat. No. 6,312,134, the disclosure content of which is incorporated in the subject matter of this description by reference.

Figure 5:
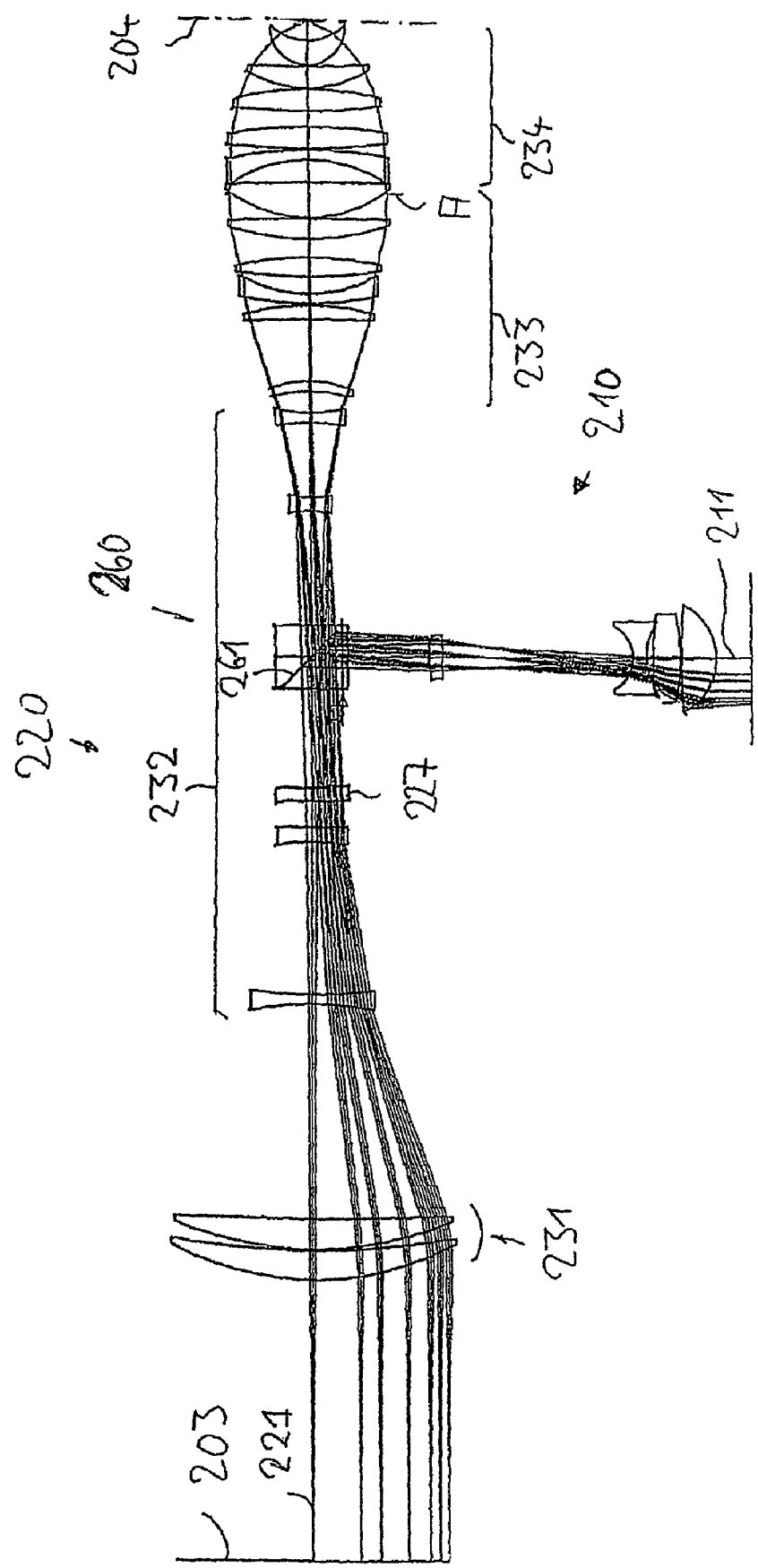
FIG. 5 shows a lens section through a second embodiment of a refractive reduction objective with central coupling-in of illumination light.

FIG. 5 shows a second embodiment of a refractive projection objective 220, which is designed for 193 nm and is assigned an illumination system 210 for centrally coupling in illumination radiation with the aid of a polarization beam splitter. Identical or corresponding features or groups of features are designated by the same reference symbols as in FIG. 2, increased by 100. The specification of the projection objective is specified in Table 5, and the specification of the illumination system is specified in Table 6. All lenses of the overall system are spherical and are composed of synthetic quartz glass (n≈1.56), as a result of which production becomes relatively simple and cost-effective. Given an imaging scale β=0.01, an image-side numerical aperture NA=0.9 is achieved given an image field diameter of 2 mm. The projection objective is designed for imaging the image of a planar mask arranged in the planar object surface 203 into the likewise planar image plane 204.

The projection system comprises a first lens group 231 with positive refractive power directly following the object plane, a second lens group 232 with negative refractive power directly following said first lens group, a third lens group 233 with positive refractive power directly following said second lens group, and a fourth lens group 234 with positive refractive power directly following said third lens group, an aperture diaphragm A being arranged in the transition region between the third lens group 233 and the fourth lens group 234 in the vicinity of the location with the maximum beam bundle diameter. This results in a so-called single-waist system with a single constriction of the beam bundle diameter in the region of the negative group 232. In this region having a minimal beam bundle diameter, a polarization beam splitter cube 260 having a small volume is arranged between two biconcave lenses with negative refractive power in each case, the planar polarization beam splitter surface 261 of said cube being at an angle of 45° both with respect to the optical axis 221 of the projection objective and with respect to the optical axis 211 of the illumination system. A λ/4 delay device (plate 227) is arranged between the polarization beam splitter surface 261 and the object plane 201. The operating procedure of the projection system that can be operated with polarized light corresponds to that of the system from FIG. 2, for which reason reference is made to the description thereof.

In contrast to the embodiment in accordance with FIG. 2, here the input-side positive group 231 ensures that the beam path in the object space is virtually telecentric (telecentric error<1 mrad), so that the illumination radiation or the main beams thereof are incident perpendicularly on the planar mask over the entire plane of the object. Image-side telecentricity is likewise afforded.

Figure 6:
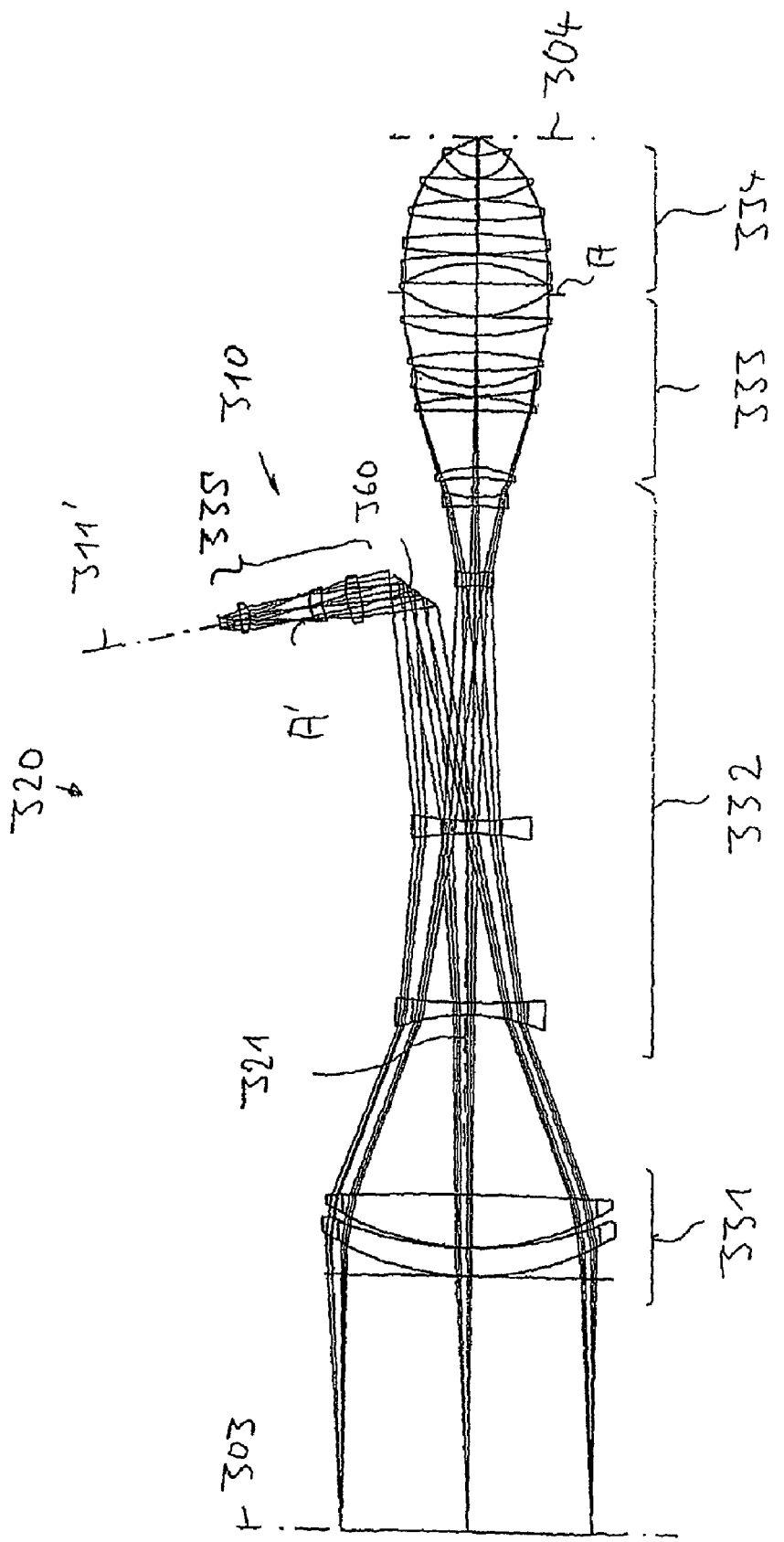
FIG. 6 shows a third embodiment of a refractive reduction objective with eccentric coupling-in of illumination light.

The lens section in FIG. 6 shows a third embodiment of a refractive projection objective 320 with assigned illumination system 310. Identical or corresponding features or groups of features are designated by the same reference symbols as in FIG. 3, increased by 100. The specification of the projection objective, which is constructed exclusively with spherical quartz glass lenses, is specified in Table 7, and that of the illumination system, which is equipped with two aspheres, is specified in Table 8, the aspherical constants being specified in Table 9. Given an operating wavelength of 193 nm and an imaging scale β=0.01, the system achieves an image-side numerical aperture NA=0.9 given an image field diameter of 2 mm. It has an image-side focal length f'>250 mm. This is favorable for limiting the telecentric zone error.

In contrast to the embodiment in accordance with FIG. 5, the projection system 310, 320 is designed for obliquely coupling illumination radiation into the projection objective. For this purpose, a planar deflection mirror 360 is provided in the illumination system 310, said deflection mirror being at an angle of 45° with respect to that part of the optical axis of the illumination system which is defined by the entry-side elements. This input-side element group 335 of the illumination system is arranged in a side arm with respect to the projection objective, which is inclined by approximately 10 to 15° with respect to the optical axis 321 of said projection objective. The exit-side part of the optical axis of the illumination system, which results from folding of the input-side part 311' at the deflection mirror 360, thus forms an acute angle of approximately 15° with the optical axis 321 of the projection objective and the planar image surface 303 of the projection objective, which is simultaneously the exit surface of the illumination system, is inclined obliquely with respect to said optical axis. In the case of this illumination system 310, the lenses of the exit-side element group of the illumination system which are arranged between deflection mirror 360 and surface 303 are arranged eccentrically with respect to the optical axis of said system. The reflective reticle that is to be arranged in the object plane 303 is thereby illuminated obliquely. By virtue of arranging the coupling-in device 360 outside the imaging beam path of the projection objective, it is possible for the projection apparatus to be operated with non-polarized light. In order that the coupling-in angle of the illumination radiation is kept as small as possible with respect to the optical axis of the projection objective, the deflection mirror 360 is arranged in direct proximity to the negative tens having the smallest diameter of the negative group 332. Therefore, in this case as well, the illumination radiation is coupled in that constriction region in which minimum beam bundle diameters are present within the projection objective. Small coupling-in angles are possible as a result of this.

Further embodiments of projection objectives having a greatly demagnifying imaging scale β=0.01 and a large image-side numerical aperture NA=0.9 and also an image field diameter that is sufficient for microlithography are shown with reference to FIGS. 7 to 10. All of the embodiments are distinguished by strict telecentricity in the image space, in which case strict telecentricity may, but need not, be present on the object side as well. Object-side operating distances>200 mm and image-side operating distances>5 mm are achieved given structural lengths L (axial distance between object surface and image surface) of 1000 mm for all of the systems. The exemplary systems are in each case designed for an operating wavelength of 193 nm, but can also be modified by a slight modification for other wavelengths, for example 157 nm or 248 nm.

Figure 7:
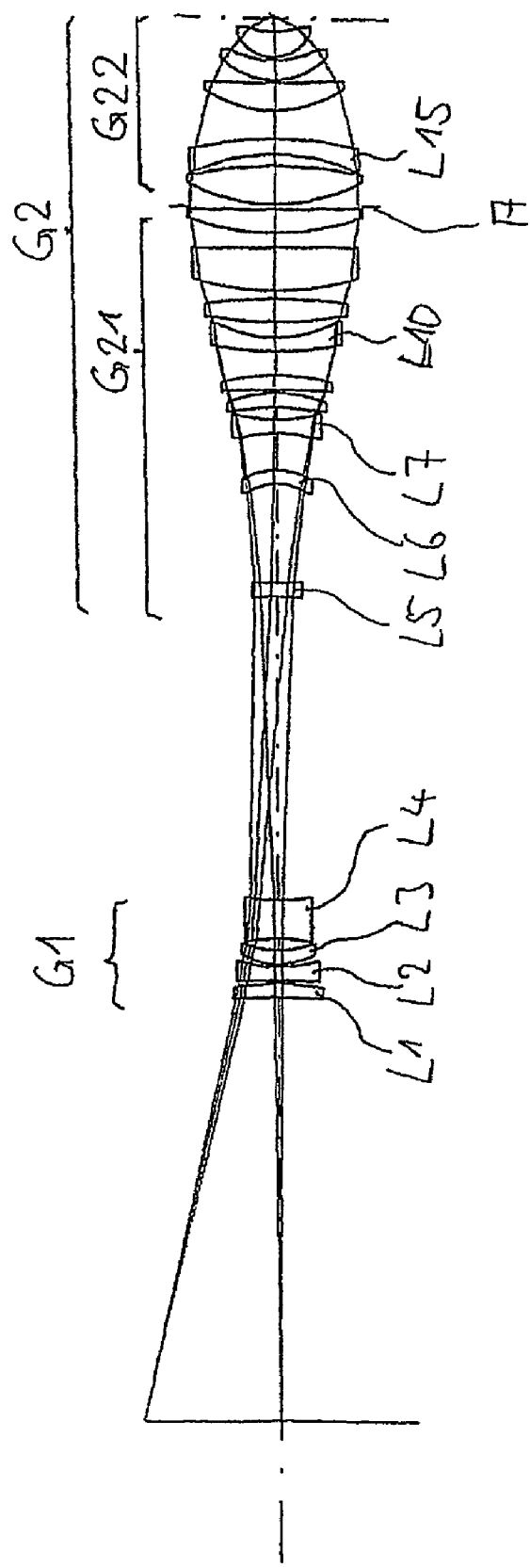
FIG. 7 shows a lens section through a fourth embodiment of a refractive reduction objective.
Figure 8:
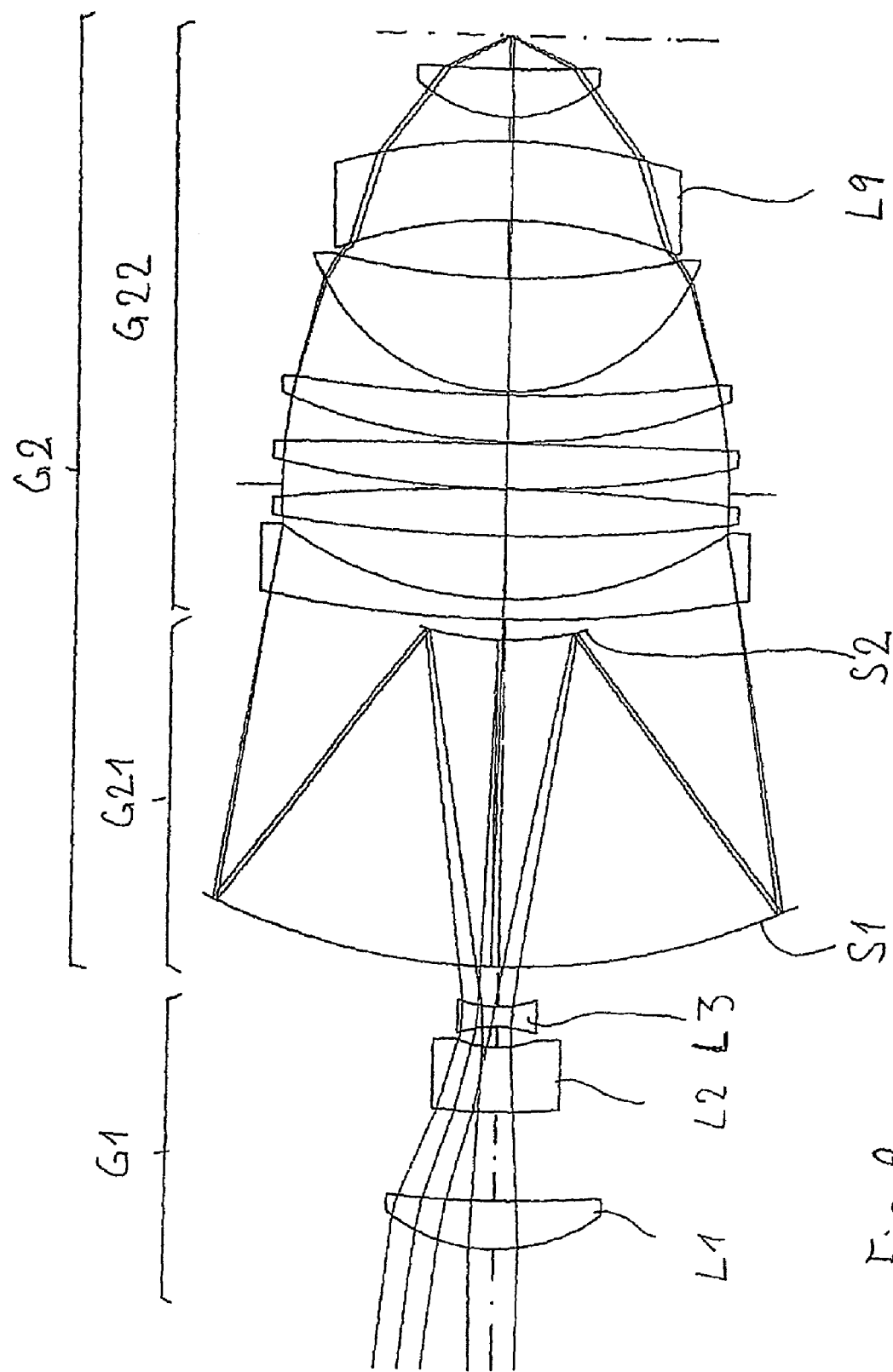
FIG. 8 shows a lens section through a first embodiment of a catadioptric reduction objective.

The system specification of the embodiment in accordance with FIG. 7 is specified in Table 10, that of the embodiment in accordance with FIG. 8 is specified in Tables 11 and 12, that of the embodiment in accordance with FIG. 9 is specified in Tables 13 and 14 and that of the embodiment in accordance with FIG. 10 is specified in Table 15.

The projection objectives represent possible basic forms which can advantageously be assigned an illumination system in a similar manner to that in FIGS. 1-4.

The systems structurally comprise a first negative lens group (N) and a positive lens group (P) following the latter, the positive lens group preferably comprising two positive lens groups between which the aperture diaphragm A is positioned in such a way that a strictly telecentric beam path prevails in the image space.

Functionally, the first negative lens group, which is also referred to hereinafter as "negative front element", images the object virtually and in demagnified fashion. The positive second lens group, which is also referred to hereinafter as "positive rear element", further demagnifies the virtual intermediate image and images it into the image plane in real fashion.

A telecentric beam path in the object space is achieved, independently of the system construction, in principle by the use of an additional positive front element (an additional positive lens group at the entry of the objective). The requisite high expansion of the beam bundles is ensured either dioptrically, by lenses having negative refractive power, or by mirror arrangements. In this case, the production of a real intermediate image may also be provided (FIG. 9). The waist structure of the systems is unambiguous: one waist between the negative front element and the positive rear element, its thickness increasing as the structural length is reduced.

The structure represented in general terms above will be demonstrated by four exemplary embodiments (FIGS. 7 to 10).

In one embodiment (FIG. 7), the system comprises a negative front element G1 and a positive rear element G2 formed from two positive lens groups G21 and G22. The front element, which principally influences the distortion but also significantly influences the astigmatism of the system, comprises four lenses having a successively alternating effect: L1(P)-L2(N)-L3(P)-L4(N). The subsequent three negative lenses L5, L6 and L7 substantially contribute to the expansion of the beam bundle, purely dioptrically in this first embodiment. The constriction of the beam bundles given the desired numerical aperture is performed by the refractive second lens group G22. The high degree of undercorrection of the spherical aberration is principally compensated for by the negative menisci L10 and L15. The negative meniscus L15 additionally corrects the severe negative coma of the last lens group (G22). The system is corrected well over the entire field with 18 spherical lenses. The maximum RMS value of the wave aberration is below 27 m$\lambda$ given a wavelength of 193 nm and a numerical aperture NA of 0.9.

The structure of the embodiment in accordance with FIG. 8 differs significantly from that in FIG. 7. The negative lenses for expanding the beam bundle and practically the complete first lens group of the rear element have been replaced here by a mirror system of the Cassegrain type. The constriction of the beam bundles to the desired numerical aperture is effected by means of the refractive second lens group G22. The front negative lens element comprises one positive lens L1 and two successive negative lenses L2 and L3 and principally corrects the distortion. The negative astigmatism introduced by the first lens L1 and the first mirror S1 is substantially compensated for by that of the negative lenses L2 and L3 and by the aspherical contribution of the first mirror. The coarse correction of the spherical aberration is effected by means of the negative meniscus L9. The substantial proportion of the fine correction of the imaging errors is effected by the two aspherical mirrors S1 and S2. The result is a compact (10 spherical lenses and two aspherical mirrors) high-aperture (NA 0.9) projection objective, with excellent correction over the entire field (RMS of the wave aberration below 14 m$\lambda$) at a wavelength of 193 nm. The vignetting of the system is 25%.

The embodiment in accordance with FIG. 9 is also subject to the design principles mentioned above. In this case, the aperture was kept small in the entire lens system. The expansion and constriction of the beam bundles in order to achieve the numerical aperture is performed here by an element formed from two mirrors S1 and S2. The latter practically form an "aperture increasing add-on" AP which images a real intermediate image IMI into the image plane and which carries out the correction of the image field curvature.

The refractive part of the system, which generates the intermediate image, is formed from a front negative lens element G1 having four lenses: L1 (N), L2 (P), L3(N) and L4(N), and a positive rear lens element G2 having the two positive lens groups G21 and G22 in each case formed from four lenses, which, given a small numerical aperture, supplies an intermediate image that is not free of aberration but is a real, coarsely corrected intermediate image. The roles of the system elements in the correction are retained. The fine correction is performed by the aspherical mirror S2. The correction is excellent over the entire field and the maximum RMS value of the wave aberration is below 6 m$\lambda$. The operating distance is 5 mm and is essentially limited by the obscuration.

The embodiment in accordance with FIG. 10 is a double-telecentric system. By virtue of the introduced first positive lens element G1 comprising two positive lenses L1 and L2, the system becomes afocal but is corrected for finite vertex focal lengths. The waist of the system is clearly determined by the structural length in this case. The strict telecentricity in the object space is complied with over the entire field, without aspheres, and is less than 20 μrad, even less than 10 μrad in the image space. The second negative lens element G21, formed from the negative lenses L3, L4 and L5, compensates for the negative distortion introduced by the first positive lens element G1. The other system elements in each case perform the specific correction tasks. The system, without the use of aspheres, is corrected well over the entire field with a maximum RMS value of the wave aberration of 25.6 m$\lambda$.

Taking the above principles into consideration, projection objectives having a high aperture and a very large imaging scale are thus possible, in particular $\frac{1}{200} \leq \beta \leq \frac{1}{50}$ holding true. The projection objective preferably has three lens groups LG1, LG2 and LG3, LG1 having negative refractive power, LG2 having positive refractive power and LG3 having positive refractive power, the aperture diaphragm being situated between LG2 and LG3 and a minimum beam height being present between LG1 and LG2 (single-waist system).

It goes without saying that all the systems described above may be complete systems, i.e. systems for forming a real image (e.g. on a wafer) of a real object (e.g. a photolithography mask). However, the systems may also be utilized as subsystems of larger systems. Thus, by way of example, the "object" of one of the systems described above may be an image generated by an imaging system (relay system) upstream of the object plane. Likewise, an image formed by one of the systems described above may serve as an object for a system (relay system) downstream of the image plane.

TABLE 1

Projection objective, NA 0.9, ymax = 100 mm;
Wavelength  194.00  193.50  193.00
'SIO2HL'  1.559200  1.559980  1.560770

| Surf. | Radius | Distance | Material | ½ Diameter |
|---|---|---|---|---|
| 0 | 400.000000000 | 324.640162254 | AIR | 100.000 |
| 1 | 86.430020411 | 10.000003835 | SIO2HL | 23.171 |
| 2 | 48.298293282 | 10.196699688 | AIR | 20.243 |
| 3 | −69.736895774 | 10.000000000 | SIO2HL | 19.795 |
| 4 | 299.409537246 | 1.000011900 | AIR | 19.932 |
| 5 | 59.098845360 | 10.016450571 | SIO2HL | 20.139 |
| 6 | 361.588827809 | 33.800314484 | AIR | 19.473 |
| 7 | −48.142016065 | 10.910436584 | SIO2HL | 15.849 |
| 8 | −188.589678970 | 13.187730911 | AIR | 16.506 |
| 9 | 0.000000000 | 22.500000000 | SIO2HL | 16.930 |
| 10 | 0.000000000 | 22.500000000 | SIO2HL | 17.369 |
| 11 | 0.000000000 | 238.153562537 | AIR | 17.808 |
| 12 | −47.087296523 | 10.000000057 | SIO2HL | 24.848 |
| 13 | −55.946001520 | 0.000000000 | AIR | 27.185 |
| 14 | 0.000000000 | 1.000000105 | AIR | 27.634 |
| 15 | −220.741509615 | 10.011681907 | SIO2HL | 27.588 |
| 16 | 100.646958420 | 9.769512000 | AIR | 28.964 |
| 17 | −191.483547871 | 10.000000002 | SIO2HL | 30.011 |
| 18 | −107.053843656 | 31.361229507 | AIR | 32.015 |
| 19 | −1088.914925000 | 10.419293442 | SIO2HL | 40.661 |
| 20 | −212.764076328 | 1.000001299 | AIR | 41.838 |
| 21 | 341.430278820 | 10.000000000 | SIO2HL | 43.074 |
| 22 | 88.504006184 | 10.740662220 | AIR | 44.113 |

TABLE 1-continued

Projection objective, NA 0.9, ymax = 100 mm;
Wavelength 194.00 193.50 193.00
'SIO2HL' 1.559200 1.559980 1.560770

| Surf. | Radius | Distance | Material | ½ Diameter |
|---|---|---|---|---|
| 23 | 337.809858066 | 12.360916607 | SIO2HL | 45.193 |
| 24 | −483.266284192 | 2.858639616 | AIR | 47.007 |
| 25 | 196.238117170 | 13.028202555 | SIO2HL | 51.249 |
| 26 | 1913.793681630 | 2.328540409 | AIR | 52.005 |
| 27 | 145.034986636 | 13.584189177 | SIO2HL | 54.295 |
| 28 | 383.639099907 | 20.841018033 | AIR | 54.083 |
| 29 | 0.000000000 | 1.928784758 | AIR | 51.892 |
| 30 | 120.907404674 | 24.996463895 | SIO2HL | 55.162 |
| 31 | −291.699215879 | 10.015685791 | AIR | 54.127 |
| 32 | −114.053675815 | 11.319657831 | SIO2HL | 53.448 |
| 33 | −192.963675620 | 9.323130134 | AIR | 53.185 |
| 34 | 126.118178150 | 17.385856739 | SIO2HL | 48.152 |
| 35 | −1086.537521640 | 1.000000151 | AIR | 46.324 |
| 36 | 59.228308280 | 16.486503734 | SIO2HL | 38.594 |
| 37 | 128.061605717 | 3.509338771 | AIR | 34.453 |
| 38 | 30.110842822 | 17.170156067 | SIO2HL | 24.681 |
| 39 | 59.767761856 | 10.655162430 | AIR | 17.607 |
| 40 | 0.000000000 | 0.000000000 | AIR | 1.000 |

TABLE 2

Aspherical constants:
Surface 1:

| | |
|---|---|
| K | 0.000000 |
| C1 | 0.208036E−06 |
| C2 | 0.990359E−10 |
| C3 | −0.619573E−13 |
| C4 | 0.163266E−15 |
| C5 | −0.774244E−19 |
| C6 | −0.894961E−23 |

TABLE 3

| Surf. | Radius | Distance | Material | ½ Diameter |
|---|---|---|---|---|
| 0 | 400.000000000 | 324.640162254 | AIR | 100.000 |
| 1 | 86.430020411 | 10.000003835 | SIO2HL | 21.163 |
| 2 | 48.298293282 | 10.196699688 | AIR | 18.370 |
| 3 | −69.736895774 | 10.000000000 | SIO2HL | 17.632 |
| 4 | 299.409537246 | 1.000011900 | AIR | 17.478 |
| 5 | 59.098845360 | 10.016450571 | SIO2HL | 17.522 |
| 6 | 361.588827809 | 33.800314484 | AIR | 16.736 |
| 7 | −48.142016065 | 10.910436584 | SIO2HL | 12.519 |
| 8 | −188.589678970 | 13.187730911 | AIR | 12.688 |
| 9 | 0.000000000 | 22.500000000 | SIO2HL | 12.468 |
| 10 | 0.000000000 | 22.500000000 | SIO2HL | 12.235 |
| 11 | 0.000000000 | 21.940616164 | AIR | 12.003 |
| 12 | 59.405096099 | 10.000000057 | SIO2HL | 11.630 |
| 13 | −125.652397253 | 15.313992124 | AIR | 10.946 |
| 14 | 0.000000000 | 12.139905344 | AIR | 8.106 |
| 15 | −22.810212259 | 24.751161536 | SIO2HL | 8.576 |
| 16 | −26.599270383 | 1.000000000 | AIR | 12.566 |
| 17 | 146.177135267 | 10.000000702 | SIO2HL | 12.449 |
| 18 | −199.636413998 | 5.722658490 | AIR | 11.991 |
| 19 | −25.600443300 | 10.000000002 | SIO2HL | 12.201 |
| 20 | −20.762693694 | 43.720377220 | AIR | 14.031 |
| 21 | 0.000000000 | 0.000000000 | AIR | 12.997 |

TABLE 4

Aspherical constants:

| | Surface 1: | | Surface 18: |
|---|---|---|---|
| K | 0.0000 | K | 0.0000 |
| C1 | 2.08035878e−007 | C1 | 1.83727945e−005 |

TABLE 4-continued

Aspherical constants:

| C2 | 9.90358643e−011 | C2 | 4.20815221e−008 |
|---|---|---|---|
| C3 | −6.19573221e−014 | C3 | 3.20433900e−010 |
| C4 | 1.63266245e−016 | C4 | −7.68096392e−013 |
| C5 | −7.74243609e−020 | C5 | 2.84350531e−015 |
| C6 | −8.94961378e−024 | C6 | 5.67626144e−017 |
| C7 | 0.00000000e+000 | C7 | 0.00000000e+000 |
| C8 | 0.00000000e+000 | C8 | 0.00000000e+000 |
| C9 | 0.00000000e+000 | C9 | 0.00000000e+000 |

Surface 20:

| | |
|---|---|
| K | 0.0000 |
| C1 | 6.05746008e−008 |
| C2 | −2.50070662e−008 |
| C3 | 2.41271105e−010 |
| C4 | −2.19540127e−012 |
| C5 | 8.12030161e−015 |
| C6 | −1.65528888e−017 |
| C7 | 0.00000000e+000 |
| C8 | 0.00000000e+000 |

TABLE 5

Projection objective, NA 0.9, ymax = 100 mm;
Wavelength 194.00 193.50 193.00
'SIO2HL' 1.559200 1.559980 1.560770

| Surf. | Radius | Distance | Material | ½ Diameter |
|---|---|---|---|---|
| 0 | 0.000000000 | 200.000000000 | AIR | 100.000 |
| 1 | 0.000000000 | 0.000000000 | AIR | 101.802 |
| 2 | 227.259386774 | 20.512819389 | SIO2HL | 102.020 |
| 3 | 594.392475879 | 1.000000000 | AIR | 101.169 |
| 4 | 272.073100987 | 21.454554631 | SIO2HL | 99.300 |
| 5 | 2078.892657600 | 153.069166701 | AIR | 98.066 |
| 6 | −237.215239991 | 7.000000000 | SIO2HL | 43.910 |
| 7 | 335.659052798 | 110.007809302 | AIR | 41.844 |
| 8 | −148.011229130 | 10.003369181 | SIO2HL | 24.499 |
| 9 | 725.332588478 | 100.000000000 | AIR | 23.970 |
| 10 | 0.000000000 | 22.796744000 | SIO2HL | 19.201 |
| 11 | 0.000000000 | 22.796743897 | SIO2HL | 18.503 |
| 12 | 0.000000000 | 82.259848661 | AIR | 17.804 |
| 13 | −87.290253452 | 10.009390374 | SIO2HL | 13.919 |
| 14 | 66.185108650 | 53.661204241 | AIR | 14.268 |
| 15 | −224.422372825 | 7.125995415 | SIO2HL | 23.037 |
| 16 | 100.936364895 | 15.275378203 | AIR | 24.713 |
| 17 | −124.438620076 | 7.674249916 | SIO2HL | 28.422 |
| 18 | −79.265280937 | 43.541855173 | AIR | 30.164 |
| 19 | −1542.371382040 | 9.904443360 | SIO2HL | 45.489 |
| 20 | −196.900428214 | 1.220814596 | AIR | 46.524 |
| 21 | 237.152709647 | 7.000150521 | SIO2HL | 48.741 |
| 22 | 103.229208453 | 12.317171426 | AIR | 49.323 |
| 23 | 361.478928608 | 13.765040133 | SIO2HL | 50.866 |
| 24 | −263.605736564 | 13.230599110 | AIR | 51.943 |
| 25 | 192.037443483 | 14.367433759 | SIO2HL | 58.068 |
| 26 | −4532.648285910 | 17.776408871 | AIR | 58.174 |
| 27 | 0.000000000 | 0.000000000 | AIR | 58.639 |
| 28 | 0.000000000 | −16.776038017 | AIR | 58.639 |
| 29 | 101.246526427 | 24.817355640 | SIO2HL | 58.732 |
| 30 | −2946.488476690 | 15.911928535 | AIR | 57.553 |
| 31 | −111.816219499 | 7.000083871 | SIO2HL | 57.311 |
| 32 | −336.209838778 | 1.000000022 | AIR | 57.657 |
| 33 | 508.537366488 | 15.280833710 | SIO2HL | 57.033 |
| 34 | −423.712654217 | 11.073774072 | AIR | 56.335 |
| 35 | 421.433970292 | 15.377811583 | SIO2HL | 52.481 |
| 36 | −240.474050771 | 1.000000000 | AIR | 51.292 |
| 37 | 89.721174516 | 15.078915013 | SIO2HL | 43.250 |
| 38 | 805.790847030 | 1.000733256 | AIR | 40.806 |
| 39 | 27.796341414 | 17.226237334 | SIO2HL | 25.798 |
| 40 | 39.489274732 | 14.237173922 | AIR | 19.623 |
| 41 | 0.000000000 | 0.000000000 | AIR | 1.001 |

TABLE 6

| Surf. | Radius | Distance | Material | ½ Diameter |
|---|---|---|---|---|
| 0 | 0.000000000 | 200.000000000 | AIR | 100.000 |
| 1 | 0.000000000 | 0.000000000 | AIR | 101.813 |
| 2 | 227.259386774 | 20.512819389 | SIO2HL | 102.033 |
| 3 | 594.392475879 | 1.000000000 | AIR | 101.183 |
| 4 | 272.073100987 | 21.454554631 | SIO2HL | 99.313 |
| 5 | 2078.892657600 | 153.069166701 | AIR | 98.081 |
| 6 | −237.215239991 | 7.000000000 | SIO2HL | 43.926 |
| 7 | 335.659052798 | 110.007809302 | AIR | 41.860 |
| 8 | −148.011229130 | 10.003369181 | SIO2HL | 24.523 |
| 9 | 725.332588478 | 100.000000000 | AIR | 23.995 |
| 10 | 0.000000000 | 22.796744000 | SIO2HL | 19.246 |
| 11 | 0.000000000 | 22.796743897 | SIO2HL | 18.550 |
| 12 | 0.000000000 | 63.543520754 | AIR | 17.854 |
| 13 | 62.084050924 | 10.000000000 | SIO2HL | 14.739 |
| 14 | 3678.767855610 | 34.942502744 | AIR | 13.769 |
| 15 | 0.000000000 | 105.027044179 | AIR | 7.371 |
| 16 | −26.045181074 | 10.000000000 | SIO2HL | 13.899 |
| 17 | 44.331060902 | 5.155446669 | AIR | 18.549 |
| 18 | 224.821093630 | 20.000000000 | SIO2HL | 21.651 |
| 19 | −143.983183676 | 1.000000000 | AIR | 30.223 |
| 20 | 793.158151498 | 24.996311285 | SIO2HL | 34.131 |
| 21 | −43.611089630 | 25.338087648 | AIR | 36.180 |
| 22 | 0.000000000 | 0.000000000 | AIR | 33.370 |

TABLE 7

Projection objective, NA 0.9, ymax = 100 mm;
Wavelength 194.00 193.50 193.00
'SIO2HL' 1.559200 1.559980 1.560770

| Surf. | Radius | Distance | Material | ½ Diameter |
|---|---|---|---|---|
| 0 | 0.000000000 | 200.000000000 | AIR | 100.000 |
| 1 | 0.000000000 | 0.000000000 | AIR | 101.812 |
| 2 | 222.072588602 | 21.859808138 | SIO2HL | 102.037 |
| 3 | 283.961110297 | 0.000000000 | AIR | 99.413 |
| 4 | 0.000000000 | 1.000000000 | AIR | 100.624 |
| 5 | 220.193677380 | 40.319658086 | SIO2HL | 98.973 |
| 6 | −2515.128684440 | 140.301529862 | AIR | 95.701 |
| 7 | −161.961243579 | 9.825065918 | SIO2HL | 44.049 |
| 8 | 645.031597416 | 0.000000000 | AIR | 42.028 |
| 9 | 0.000000000 | 0.000000000 | AIR | 42.228 |
| 10 | 0.000000000 | 132.110493192 | AIR | 42.228 |
| 11 | −251.603890537 | 10.003369181 | SIO2HL | 23.092 |
| 12 | 275.629264975 | 185.763019339 | AIR | 22.385 |
| 13 | −87.846806387 | 10.009390374 | SIO2HL | 13.827 |
| 14 | 65.828141814 | 53.738371464 | AIR | 14.175 |
| 15 | −225.449501895 | 7.198681414 | SIO2HL | 22.958 |
| 16 | 100.814083822 | 15.360993004 | AIR | 24.636 |
| 17 | −122.984481803 | 7.734840976 | SIO2HL | 28.366 |
| 18 | −78.038516367 | 43.900085312 | AIR | 30.111 |
| 19 | −1322.796921570 | 10.134945317 | SIO2HL | 45.382 |
| 20 | −196.830795876 | 1.334588683 | AIR | 46.488 |
| 21 | 237.122948890 | 7.000000000 | SIO2HL | 48.725 |
| 22 | 103.288957019 | 12.344192111 | AIR | 49.306 |
| 23 | 361.770986635 | 13.817623576 | SIO2HL | 50.866 |
| 24 | −263.675534964 | 13.230599110 | AIR | 51.953 |
| 25 | 191.990830428 | 14.398227683 | SIO2HL | 58.066 |
| 26 | −4531.012021150 | 17.784327737 | AIR | 58.171 |
| 27 | 0.000000000 | 0.000000000 | AIR | 58.628 |
| 28 | 0.000000000 | −16.784327737 | AIR | 58.628 |
| 29 | 101.507548398 | 24.817355840 | SIO2HL | 58.717 |
| 30 | −2743.245741810 | 15.942240527 | AIR | 57.536 |
| 31 | −111.808142102 | 7.000000000 | SIO2HL | 57.257 |
| 32 | −335.669122363 | 1.000000000 | AIR | 57.598 |
| 33 | 509.243573292 | 15.272816584 | SIO2HL | 56.972 |
| 34 | −423.548229138 | 11.080839090 | AIR | 56.272 |
| 35 | 421.919394577 | 15.377191275 | SIO2HL | 52.417 |
| 36 | −240.473101534 | 1.002269600 | AIR | 51.224 |
| 37 | 89.733023828 | 15.115222564 | SIO2HL | 43.205 |
| 38 | 807.173847447 | 1.000000000 | AIR | 40.735 |
| 39 | 27.852445627 | 17.229076198 | SIO2HL | 25.805 |
| 40 | 39.619744214 | 14.232202664 | AIR | 19.600 |
| 41 | 0.000000000 | 0.000000000 | AIR | 1.002 |

TABLE 8

| Surf. | Radius | Distance | Material | ½ Diameter |
|---|---|---|---|---|
| 0 | 0.000000000 | 17.583000000 | AIR | 5.259 |
| 1 | 0.000000000 | 0.000000000 | AIR | 9.592 |
| 2 | −69.601732315 | 7.527921217 | SIO2HL | 9.413 |
| 3 | −18.609441116 | 41.700289171 | AIR | 10.514 |
| 4 | 0.000000000 | 7.566135710 | AIR | 9.454 |
| 5 | 27.904520638 | 10.000000000 | SIO2HL | 11.766 |
| 6 | 25.416277956 | 20.000000000 | AIR | 11.440 |
| 7 | 66.200568289 | 11.344447957 | SIO2HL | 16.361 |
| 8 | −165.164448263 | 43.950455000 | AIR | 16.975 |
| 9 | 0.000000000 | 47.309396456 | AIR | 19.437 |
| 10 | 0.000000000 | 142.059091012 | AIR | 62.387 |
| 11 | −275.629264975 | 10.003369181 | SIO2HL | 45.764 |
| 12 | 251.603890537 | 132.110493192 | AIR | 45.490 |
| 13 | −645.031597416 | 9.825065918 | SIO2HL | 55.548 |
| 14 | 161.961243579 | 140.301529862 | AIR | 57.421 |
| 15 | 2515.128684440 | 40.319658086 | SIO2HL | 109.216 |
| 16 | −220.193677380 | 1.000000000 | AIR | 110.982 |
| 17 | −283.961110297 | 21.859808138 | SIO2HL | 111.259 |
| 18 | −222.072588602 | 0.000000000 | AIR | 113.539 |
| 19 | 0.000000000 | 200.000000037 | AIR | 111.711 |
| 20 | 0.000000000 | 0.000000000 | AIR | 100.000 |

TABLE 9

Aspherical constants:

| | Surface 2: | | Surface 7: |
|---|---|---|---|
| K | 0.0000 | K | 0.0000 |
| C1 | −1.74492134e−005 | C1 | −1.39573765e−007 |
| C2 | 5.37710337e−008 | C2 | −2.52235172e−009 |
| C3 | 5.42537441e−010 | C3 | −8.70458774e−012 |
| C4 | 1.02328167e−012 | C4 | −1.63660511e−014 |
| C5 | −2.21171111e−014 | C5 | 1.42409048e−017 |
| C6 | −3.69659022e−016 | C6 | 3.19420258e−019 |
| C7 | 0.00000000e+000 | C7 | 0.00000000e+000 |
| C8 | 0.00000000e+000 | C8 | 0.00000000e+000 |
| C9 | 0.00000000e+000 | C9 | 0.00000000e+000 |

TABLE 10

Projection objective, NA 0.9, ymax = 100 mm;
Wavelength 194.00 193.50 193.00
'SIO2HL' 1.559200 1.559980 1.560770

| Surf. | Radius | Distance | Material |
|---|---|---|---|
| 0 | 0.00000 | 300.000000 | AIR |
| 1 | −517.07543 | 10.000000 | SIO2HL' |
| 2 | −163.08614 | 2.000000 | AIR |
| 3 | −929.10544 | 10.000000 | SIO2HL' |
| 4 | 93.45465 | 2.000000 | AIR |
| 5 | 53.31164 | 10.000000 | SIO2HL' |
| 6 | 68.85257 | 8.229234 | AIR |
| 7 | −128.69071 | 27.563591 | SIO2HL' |
| 8 | 131.38012 | 215.860274 | AIR |
| 9 | −201.54258 | 10.000000 | SIO2HL' |
| 10 | 209.22715 | 70.392722 | AIR |
| 11 | −42.21897 | 10.000000 | SIO2HL' |
| 12 | −54.15229 | 26.624897 | AIR |
| 13 | −106.70300 | 10.011682 | SIO2HL' |
| 14 | 132.24977 | 8.713216 | AIR |
| 15 | −176.04919 | 10.545245 | SIO2HL' |
| 16 | −95.81203 | 2.070590 | AIR |
| 17 | −626.82922 | 10.513299 | SIO2HL' |
| 18 | −166.59328 | 16.991938 | AIR |
| 19 | 239.15924 | 10.000000 | SIO2HL' |
| 20 | 96.38673 | 11.212496 | AIR |
| 21 | 297.45636 | 16.550887 | SIO2HL' |
| 22 | −468.78918 | 5.856122 | AIR |
| 23 | 215.85400 | 30.486079 | SIO2HL' |
| 24 | 20753.74250 | 29.113792 | AIR |
| STO | 0.00000 | −18.496728 | AIR |

TABLE 10-continued

Projection objective, NA 0.9, ymax = 100 mm;
Wavelength 194.00 193.50 193.00
'SIO2HL' 1.559200 1.559980 1.560770

| Surf. | Radius | Distance | Material |
|---|---|---|---|
| 26 | 199.84577 | 16.475516 | SIO2HL' |
| 27 | 3734.99646 | 3.949997 | AIR |
| 28 | 144.29112 | 27.158474 | SIO2HL' |
| 29 | −313.89510 | 8.376825 | AIR |
| 30 | −153.06655 | 11.319658 | SIO2HL' |
| 31 | −259.19265 | 19.911905 | AIR |
| 32 | 96.73625 | 19.312727 | SIO2HL' |
| 33 | 996.85565 | 2.000000 | AIR |
| 34 | 57.07860 | 13.965068 | SIO2HL' |
| 35 | 78.44880 | 2.000000 | AIR |
| 36 | 30.37076 | 17.863264 | SIO2HL' |
| 37 | 54.88614 | 11.427232 | AIR |
| 38 | 0.00000 | 0.000000 | AIR |

TABLE 11

Projection objective, NA 0.9, ymax = 100 mm;
Wavelength 194.00 193.50 193.00
'SIO2HL' 1.559200 1.559980 1.560770

| Surf. | Radius | Distance | Material | Type |
|---|---|---|---|---|
| 0 | 0.00000 | 691.521357 | AIR | |
| 1 | 45.79696 | 12.111642 | SIO2HL | |
| 2 | 257.48283 | 22.666246 | AIR | |
| 3 | 149.33577 | 16.416193 | SIO2HL | |
| 4 | 25.83696 | 5.251676 | AIR | |
| 5 | −32.42051 | 5.000000 | SIO2HL | |
| 6 | 28.10868 | 93.471644 | AIR | |
| 7 | 81.73885 | −83.471644 | AIR | REFL |
| 8 | 186.86814 | 88.471644 | AIR | REFL |
| 9 | 0.00000 | 0.200000 | AIR | |
| 10 | 342.74175 | 5.000000 | SIO2HL | |
| 11 | 103.30724 | 16.248363 | AIR | |
| 12 | 445.16918 | 11.996131 | SIO2HL | |
| 13 | −554.93836 | 0.100000 | AIR | |
| STO | 0.00000 | 0.100000 | AIR | |
| 15 | 281.30149 | 11.528966 | SIO2HL | |
| 16 | −4202.79513 | 0.624173 | AIR | |
| 17 | 154.80439 | 11.791730 | SIO2HL | |
| 18 | 398.49953 | 0.954762 | AIR | |
| 19 | 54.71970 | 28.548692 | SIO2HL | |
| 20 | 192.02474 | 14.588730 | AIR | |
| 21 | −128.97697 | 20.177439 | SIO2HL | |
| 22 | −156.66767 | 6.170116 | AIR | |
| 23 | 36.23416 | 12.054098 | SIO2HL | |
| 24 | 349.15440 | 8.478625 | AIR | |
| >25 | 0.00000 | 0.000018 | AIR | |

TABLE 12

Aspherical constants:

| | Surface 7: | | Surface 8: |
|---|---|---|---|
| K | 1.090334 | K | 0.023072 |
| C1 | 0.281064E−06 | C1 | 0.132767E−08 |
| C2 | 0.208114E−09 | C2 | 0.242263E−12 |
| C3 | 0.118850E−12 | C3 | −.509833E−17 |
| C4 | −.108390E−15 | C4 | 0.250415E−20 |
| C5 | −.294447E−26 | C5 | −.122848E−23 |
| C6 | −.126943E−30 | C6 | 0.256581E−27 |
| C7 | 0.240395E−23 | C7 | −.315290E−31 |
| C8 | −.689159E−26 | C8 | 0.158057E−35 |
| C9 | 0.473369E−29 | C9 | −.135368E−40 |

TABLE 13

Projection objective, NA 0.9, ymax = 100 mm;
Wavelength 194.00 193.50 193.00
'SIO2HL' 1.559200 1.559980 1.560770

| Surf. | Radius | Distance | Material | Type |
|---|---|---|---|---|
| 0 | INFINITY | 692.000000 | AIR | |
| 1 | 370.63276 | 5.741663 | SIO2HL | |
| 2 | 66.65474 | 100.244555 | AIR | |
| 3 | 279.25820 | 11.156469 | AIR | |
| 5 | 84.64407 | 5.000000 | SIO2HL | |
| 6 | 36.52968 | 6.589949 | AIR | |
| 7 | −56.19876 | 35.000000 | SIO2HL | |
| 8 | −80.74806 | 46.918698 | AIR | |
| 9 | 100.33708 | 5.000000 | SIO2HL | |
| 10 | 45.03328 | 6.996408 | AIR | |
| 11 | 90.52414 | 8.301195 | SIO2HL | |
| 12 | −359.81651 | 2.000000 | AIR | |
| 13 | 41.20802 | 5.000000 | SIO2HL | |
| 14 | 29.09382 | 12.350204 | AIR | |
| 15 | 29.29669 | 12.118549 | SIO2HL | |
| 16 | 152.26935 | 8.474905 | AIR | |
| 17 | −30.77630 | 6.179925 | SIO2HL | |
| 18 | −34.89702 | −9.222841 | AIR | |
| STO | INFINITY | 11.222841 | AIR | |
| 20 | −839.62776 | 29.200026 | SIO2HL | |
| 21 | −55.99671 | 2.000000 | AIR | |
| 22 | 73.62258 | 15.326341 | SIO2HL | |
| 23 | −71.93498 | 2.000000 | AIR | |
| 24 | 35.16113 | 6.929709 | SIO2HL | |
| 25 | −395.44925 | 48.201333 | AIR | |
| 26 | 2299.26136 | 16.075460 | SIO2HL | |
| 27 | INFINITY | −16.075460 | SIO2HL | REFL |
| 28 | 2299.26136 | −48.201333 | AIR | |
| 29 | 80.09166 | 48.201333 | AIR | REFL |
| 30 | 2299.26136 | 16.075460 | SIO2HL | |
| 31 | INFINITY | 5.000000 | AIR | |
| 32 | INFINITY | 0.000000 | | |

TABLE 14

Aspherical constants:
Surface 29:

| K | −0.007747 |
|---|---|
| C1 | 0.139640E−08 |
| C2 | 0.302115E−12 |
| C3 | 0.175726E−15 |
| C4 | −.106788E−18 |
| C5 | 0.397978E−22 |
| C6 | 0.603652E−27 |
| C7 | −.543177E−29 |
| C8 | 0.160890E−32 |
| C9 | −.163821E−36 |

TABLE 15

Projection objective, NA 0.9, ymax = 100 mm;
Wavelength 194.00 193.50 193.00
'SIO2HL' 1.559200 1.559980 1.560770

| Surf. | Radius | Distance | Material |
|---|---|---|---|
| 0 | 0.00000 | 200.000000 | AIR |
| 1 | 911.49052 | 20.000000 | SIO2HL |
| 2 | −3535.55959 | 1.000000 | AIR |
| 3 | 228.31686 | 22.391006 | SIO2HL |
| 4 | 887.19064 | 159.409733 | AIR |
| 5 | −840.22492 | 7.000000 | SIO2HL |
| 5 | 652.54704 | 213.779192 | AIR |
| 7 | −133.51080 | 7.000000 | SIO2HL |
| 8 | 168.76484 | 100.603028 | AIR |
| 9 | −63.21136 | 30.000000 | AIR |
| 11 | −137.74731 | 7.000000 | SIO2HL |
| 12 | 121.42092 | 12.731535 | AIR |

TABLE 15-continued

Projection objective, NA 0.9, ymax = 100 mm;
Wavelength 194.00 193.50 193.00
'SIO2HL' 1.559200 1.559980 1.560770

| Surf. | Radius | Distance | Material |
|---|---|---|---|
| 13 | −87.24022 | 8.364313 | SIO2HL |
| 14 | −54.11580 | 54.019262 | AIR |
| 15 | −419.73455 | 17.372064 | SIO2HL |
| 16 | −155.32420 | 1.000000 | AIR |
| 17 | −172.05345 | 68.230242 | AIR |
| STO | INFINITY | −67.230242 | AIR |
| 19 | 198.39621 | 7.000000 | SIO2HL |
| 20 | 87.44544 | 16.025941 | SIO2HL |
| 22 | −430.07760 | 13.230599 | AIR |
| 23 | 170.34465 | 13.562814 | SIO2HL |
| 24 | 3013.66820 | 1.000000 | AIR |
| 25 | 94.29242 | 24.817356 | SIO2HL |
| 26 | 3578.66609 | 14.929691 | AIR |
| 27 | −109.15751 | 15.726087 | SIO2HL |
| 28 | −585.91891 | 1.000000 | AIR |
| 29 | 480.38009 | 11.793243 | SIO2HL |
| 30 | −343.83269 | 6.476512 | AIR |
| 31 | 225.81131 | 13.014346 | SIO2HL |
| 32 | −419.29952 | 1.000000 | AIR |
| 33 | 81.41776 | 15.110686 | SIO2HL |
| 34 | 686.55454 | 1.000000 | AIR |
| 35 | 28.43692 | 16.576702 | SIO2HL |
| 36 | 47.19354 | 13.455073 | AIR |
| 37 | 0.00000 | 0.000000 | AIR |

The invention claimed is:

1. A projection objective, comprising:
a plurality of optical elements arranged along an optical axis of the projection objective to image a pattern arranged in an object surface of the projection objective into an image field arranged in an image surface of the projection objective with a demagnifying imaging scale, the optical elements being designed and arranged such that a single constriction of an imaging beam path is provided between the object surface and the image surface; wherein the projection objective is a refractive projection objective and has an image-side numerical aperture NA>0.85 and a demagnifying imaging scale |β|<0.05, and wherein the imaging field has a minimum image field diameter of more than 1 mm.

2. The projection objective as claimed in claim 1, wherein the image surface is planar and the object surface of the projection objective has a curvature that is concave with respect to the projection objective.

3. The projection objective as claimed in claim 1, wherein the object surface has a curvature that is concave with respect to the projection objective with a radius of curvature that is less than a structural length of the projection objective.

4. The projection objective as claimed in claim 1, wherein a maximum object field diameter is Dmax and a structural length is L, and wherein the object surface has a curvature that is concave with respect to the projection objective with a radius RO of curvature for which at least one of the following conditions holds true:
(1) 0.525·Dmax<RO<100·Dmax
(2) 0.525·Dmax<RO<10·L.

5. The projection objective as claimed in claim 1, wherein the projection objective comprises an object-side element group with at least one optical element of the projection objective and an image-side element group with at least one optical element of the projection objective, wherein a coupling-in device that is transmissive to the projection radiation of the imaging beam path and serves for coupling illumination radiation into the projection objective is arranged between the object-side element group and the image-side element group.

6. The projection objective as claimed in claim 5, wherein the coupling-in device is a beam splitter with a beam splitter surface oriented obliquely with respect to an optical axis of the projection objective.

7. The projection objective as claimed in claim 5, wherein the coupling-in device is a polarization beam splitter with a polarization-selective beam splitter surface oriented obliquely with respect to an optical axis of the projection objective.

8. The projection objective as claimed in claim 5, wherein the coupling-in device is arranged in the region of the constriction.

9. The projection objective as claimed in claim 1, wherein the projection objective comprises an object-side element group with at least one optical element of the projection objective and an image-side element group with at least one optical element of the projection objective, wherein the projection objective is provided with a coupling-in device configured for obliquely coupling in illumination radiation between the object-side element group and the image-side element group.

10. The projection objective as claimed in claim 1, having:
a first lens group with positive refractive power directly following the image-object surface,
a second lens group with negative refractive power directly following the first lens group,
a third lens group with positive refractive power directly following the second lens group,
a fourth lens group with positive refractive power directly following the third lens group, and
a system diaphragm arranged in a transition region from the third lens group to the fourth lens group,
wherein the constriction region having minimum beam bundle diameters is formed in the region of the second lens group with negative refractive power.

11. The projection objective as claimed in claim 10, wherein the projection objective has an at least essentially telecentric beam path in an object space.

12. The projection objective as claimed in claim 10, wherein a telecentric error is less than 50 mrad.

13. The projection objective as claimed in claim 12, wherein the telecentric error is less than 1 mrad.

14. The projection objective as claimed in claim 1, having:
a first lens group with negative refractive power directly following the object surface,
a second lens group with positive refractive power directly following the first lens group,
a third lens group with positive refractive power directly following the second lens group, and
a system diaphragm arranged in a transition region from the second lens group to the third lens group,
wherein the constriction region having minimum beam bundle diameters is formed in the region of the first lens group with negative refractive power.

15. The projection objective as claimed in claim 14, wherein the projection objective has a non-telecentric beam path in an object space.

16. The projection objective as claimed in claim 15, wherein a telecentric error in the object space is greater than 50 mrad.

17. The projection objective as claimed in claim 14, wherein a coupling-in device for illumination light is arranged in the constriction region between two lenses each with negative refractive power.

18. The projection objective as claimed in claim 1, further comprising an arrangement obliquely coupling in illumination light in the constriction region between two lenses each with negative refractive power.

19. The projection objective as claimed in claim 1, having:
    a first lens group with negative refractive power directly following the object surface, for generating a demagnified virtual intermediate image of the object field, and
    a second lens group with positive refractive power directly following the first lens group, for demagnified imaging of the virtual intermediate image into the object surface.

20. The projection objective as claimed in claim 19, having an additional lens group with positive refractive power inserted upstream of the first lens group with negative refractive power.

21. A projection exposure apparatus for microlithography comprising an illumination system for illuminating a pattern that is arranged in an object surface of a projection objective with radiation from a primary radiation source, and having a projection objective as claimed in claim 1.

22. The projection exposure apparatus as claimed in claim 21, wherein the illumination system comprises an input-side element group, following the radiation source, with at least one optical element of the illumination system and an output-side element group with at least one optical element of the illumination system, and wherein the output-side element group is a part of the projection objective.

23. The projection exposure apparatus as claimed in claim 22, wherein at least one optical element with at least one aspherical surface is arranged in the input-side element group of the illumination system.

24. The projection exposure apparatus as claimed in claim 22, wherein the output-side element group of the illumination system outputs illumination radiation to impinge at least essentially perpendicularly at least essentially over an entire illuminated area on the object surface of the projection objective, and wherein the object surface of the projection objective is the exit surface of the illumination system.

25. The projection exposure apparatus as claimed in claim 22, further comprising an aperture diaphragm of the illumination system in the input-side element group of the illumination system.

26. The projection exposure apparatus as claimed in claim 21, wherein the illumination system has an optical axis that coincides with the optical axis of the projection objective between a coupling-in device and the object surface of the projection objective.

27. The projection exposure apparatus as claimed in claim 21, wherein the illumination system has an optical axis that forms a finite angle with an optical axis of the projection objective between a coupling-in device and the object surface of the projection objective, and wherein optical elements of the output-side element group of the illumination system are arranged eccentrically with respect to the optical axis of the illumination system.

28. The projection exposure apparatus as claimed in claim 27, wherein an exit plane of the illumination system is inclined with respect to the optical axis of the illumination system.

29. The projection exposure apparatus as claimed in claim 21, wherein the projection objective has a planar object surface and the illumination system provides a telecentric beam path at the exit surface of the illumination system.

30. The projection exposure apparatus as claimed in claim 21, wherein the projection objective has a curved object surface with a curvature that is concave with respect to the projection objective and the illumination system provides a non-telecentric beam path at the exit surface of the illumination system.

31. The projection exposure apparatus as claimed in claim 21, wherein the illumination system is designed such that the image-side numerical aperture of the illumination system is greater than or equal to the object-side numerical aperture of the projection objective.

32. A method for exposing a light-sensitive substrate by means of a microlithography projection exposure apparatus, comprising:
    illuminating a reflection mask, comprising a mirror arrangement with an array of individually drivable individual mirrors, with the aid of an illumination system;
    reflecting beam bundles of the illumination radiation at the individual mirrors of the mirror arrangement;
    driving the individual mirrors of the mirror arrangement in accordance with a predetermined pattern such that only a portion of the beam bundles passes through the projection objective onto the light-sensitive substrate, so that the light-sensitive substrate is exposed by the beam bundles transmitted through the projection objective in accordance with the predetermined pattern, wherein the projection objective is configured according to claim 1.

33. The method as claimed in claim 32, wherein the mirror arrangement has a curvature that is concave with respect to the projection objective.

34. The method as claimed in claim 32, wherein the reflection mask is illuminated through an object-side part of the projection objective.

* * * * *

UNITED STATES PATENT AND TRADEMARK OFFICE
CERTIFICATE OF CORRECTION

PATENT NO. : 8,064,040 B2  Page 1 of 1
APPLICATION NO. : 11/547085
DATED : November 22, 2011
INVENTOR(S) : Aurelian Dodoc et al.

It is certified that error appears in the above-identified patent and that said Letters Patent is hereby corrected as shown below:

On the Title Page - Abstract, Line 9: delete "|b|<0.05," and insert -- $|\beta|<0.05$, --

Column 4, Line 29: delete "|β⊕>0.05," and insert -- $|\beta|>0.05$, --

Column 4, Line 37: delete "trans-missive" and insert -- transmissive --

Column 14, Line 23: delete "tens" and insert -- lens --

Column 18, Line 56: delete "24.817355640" and insert -- 24.817355840 --

Column 22, Line 8: delete "370.63276" and insert -- 370.53276 --

Column 22, Line 19: delete "152.26935" and insert -- 152.28935 --

Column 24, Line 27: in Claim 10, delete "image-object" and insert -- object --

Signed and Sealed this
Thirteenth Day of November, 2012

David J. Kappos
*Director of the United States Patent and Trademark Office*